United States Patent
Tanaka et al.

(10) Patent No.: US 10,949,132 B1
(45) Date of Patent: Mar. 16, 2021

(54) SEMICONDUCTOR STORAGE DEVICE

(71) Applicant: KIOXIA CORPORATION, Tokyo (JP)

(72) Inventors: Reika Tanaka, Kanagawa (JP);
Takayuki Miyazaki, Tokyo (JP);
Masumi Saitoh, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/803,883

(22) Filed: Feb. 27, 2020

(30) Foreign Application Priority Data

Sep. 19, 2019 (JP) .............................. JP2019-170560

(51) Int. Cl.
*G06F 3/06* (2006.01)
*H01L 27/24* (2006.01)

(52) U.S. Cl.
CPC .......... *G06F 3/0688* (2013.01); *H01L 27/249* (2013.01); *H01L 27/2454* (2013.01); *H01L 27/2472* (2013.01); *G11C 2213/71* (2013.01)

(58) Field of Classification Search
CPC ............. H01L 27/2454; H01L 27/2472; H01L 27/249; G11C 2213/71; G11C 2213/79
See application file for complete search history.

(56) References Cited

U.S. PATENT DOCUMENTS

| | | |
|---|---|---|
| 6,480,438 B1 | 11/2002 | Park |
| 8,902,635 B2 | 12/2014 | Kawahara et al. |
| 9,318,533 B2 | 4/2016 | Kalra et al. |
| 9,349,446 B2 | 5/2016 | Murooka |
| 2016/0268339 A1 | 9/2016 | Sakuma et al. |
| 2020/0265872 A1* | 8/2020 | Ota .................... H01L 45/1675 |

FOREIGN PATENT DOCUMENTS

JP 2016-171221 A 9/2016

* cited by examiner

*Primary Examiner* — Allison Bernstein
(74) *Attorney, Agent, or Firm* — Kim & Stewart LLP

(57) ABSTRACT

A storage device includes a substrate, first wirings arranged in a first direction and extending in a second direction, second wirings arranged in the second direction and extending in the first direction, resistance portions between the first and second wirings, third wirings between the second wirings and the substrate, arranged in the second direction and extending in a third direction, semiconductor portions each connected to second and third wirings, a fourth wiring extending in the second direction and facing the semiconductor portions, insulating portions between the semiconductor portions and the fourth wiring, and a contact connected to each first wiring. The semiconductor portions include a first portion and a second portion closer to the contact, and a length in the second direction of an insulating portion between the first portion and the fourth wiring is greater than that of another insulating portion between the second portion and the fourth wiring.

20 Claims, 29 Drawing Sheets

SEMICONDUCTOR STORAGE DEVICE

CROSS-REFERENCE TO RELATED APPLICATION(S)

This application is based upon and claims the benefit of priority from Japanese Patent Application No. 2019-170560, filed Sep. 19, 2019, the entire contents of which are incorporated herein by reference.

FIELD

Embodiments described herein relate generally to a semiconductor storage device.

BACKGROUND

With the high integration of semiconductor storage devices, semiconductor storage devices in which memory cells are arranged three-dimensionally are being developed. Such semiconductor storage devices use, as a memory cell, a resistive random access memory (ReRAM) using a variable-resistance element, or a flash memory using a field effect transistor capable of storing electric charge in a gate insulating layer.

DETAILED DESCRIPTION

Figure 1:
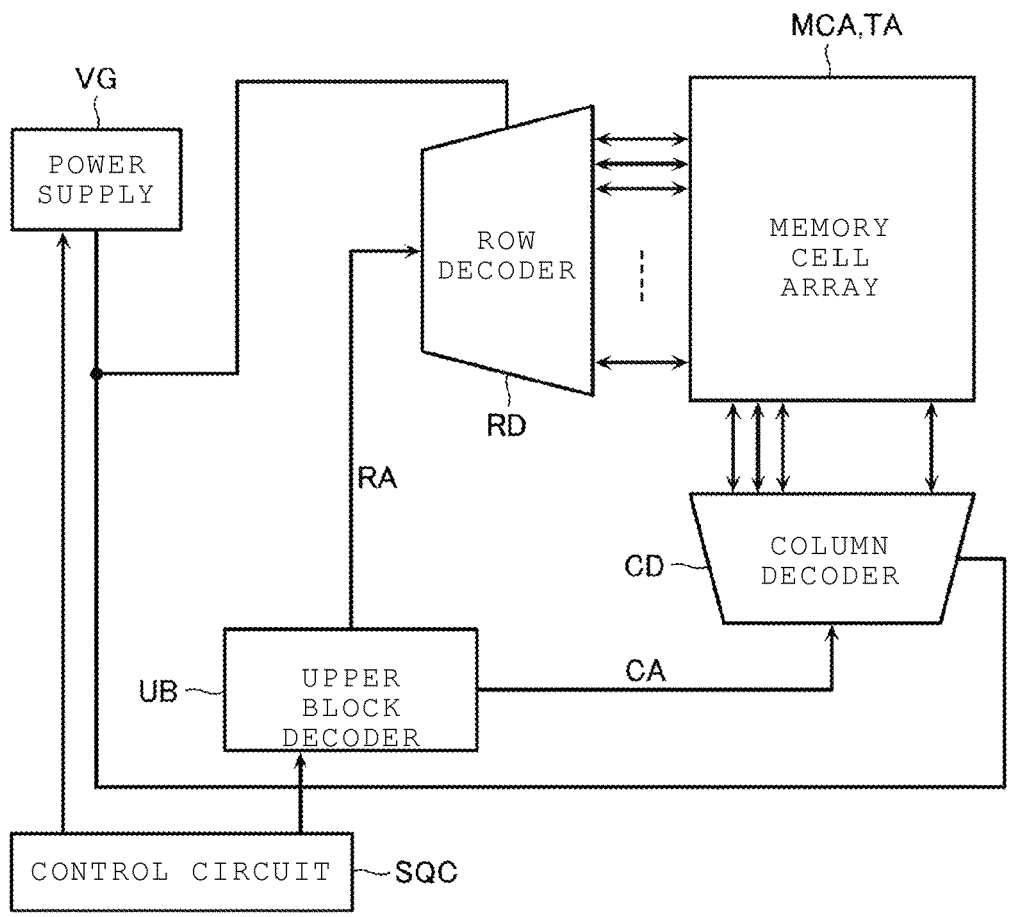
FIG. 1 is a schematic block diagram showing a partial configuration of a semiconductor storage device according to a first embodiment.

Embodiments provide a semiconductor storage device that can be suitably controlled.

In general, according to one embodiment, a semiconductor storage device includes a substrate, a plurality of first wirings arranged above the substrate in a first direction intersecting a surface of the substrate and extending in a second direction intersecting the first direction, a plurality of second wirings arranged above the substrate in the second direction and extending in the first direction, a plurality of first variable resistance portions arranged between the plurality of first wirings and the plurality of second wirings, a plurality of third wirings provided between the plurality of second wirings and the substrate, arranged in the second direction, and extending in a third direction intersecting the first and second directions, a plurality of semiconductor portions each electrically connected to one end of one of the plurality of second wirings in the first direction and one of the plurality of third wirings, a fourth wiring extending in the second direction and facing the plurality of semiconductor portions in the third direction, a plurality of first insulating portions each provided between one of the plurality of semiconductor portions and the fourth wiring, and a first contact electrically connected to an end of each of the plurality of first wirings in the second direction. The plurality of semiconductor portions include a first semiconductor portion and a second semiconductor portion closer to the first contact than the first semiconductor portion, and a length in the second direction of one of the first insulating portions between the first semiconductor portion and the fourth wiring is greater than a length in the second direction of another one of the first insulating portions between the second semiconductor portion and the fourth wiring.

Next, a semiconductor storage device according to an embodiment will be described in detail with reference to drawings. The following drawings are schematic and specific configurations can be adjusted as appropriate. In the following drawings, some components may be omitted for the sake of description. The following embodiments are merely examples and are not intended to limit the present disclosure. In the following description, the description of the same parts in a plurality of embodiments is basically omitted.

In this specification, a predetermined direction parallel to the surface of a substrate is called an X direction, a direction parallel to the surface of the substrate and perpendicular to the X direction is called a Y direction, and a direction perpendicular to the surface of the substrate is called a Z direction.

In the present specification, a direction along the predetermined surface may be referred to as a first direction, a direction intersecting the first direction along the predetermined surface may be referred to as a second direction, and a direction intersecting the predetermined surface may be referred to as a third direction. The first direction, the second direction, and the third direction may or may not correspond to any of the X direction, the Y direction, and the Z direction.

In this specification, expressions such as "upper" and "lower" are based on the substrate. For example, the direction away from the substrate along the Z direction is referred to as up, and the direction approaching the substrate along the Z direction is referred to as down. When referring to the lower surface or lower end of a certain configuration, it means the surface or end portion on the substrate side of this configuration, and when referring to the upper surface or upper end, it means the surface or end portion opposite to the substrate of this configuration. A surface intersecting the X direction or the Y direction is called a side surface.

In this specification, when it is referred that a first configuration is "electrically connected" to a second configuration, the first configuration may be directly connected to the second configuration, or the first configuration may be connected to the second configuration via a wiring, a semiconductor member, a transistor, or the like. For example, when three transistors are connected in series, a first transistor is "electrically connected" to a third transistor even if a second transistor is in an OFF state.

In this specification, when it is referred that the first configuration is "connected" between the second configuration and the third configuration, it may mean that the first configuration, the second configuration, and the third configuration are connected in series, and the first configuration is provided in a current path of the second configuration and the third configuration.

In this specification, when it is referred that a circuit or the like makes two wirings or the like "conductive", it may mean that for example, this circuit or the like includes a transistor or the like, and the transistor or the like is provided in a current path between two wirings, and the transistor or the like is turned on.

First Embodiment

[Overall Structure]

Figure 2:
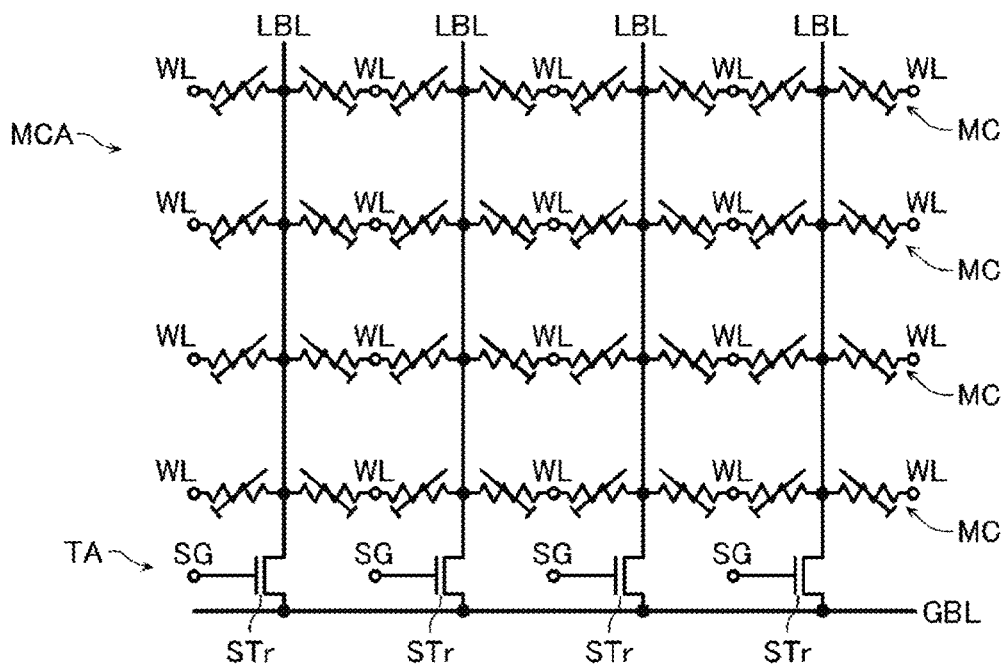
FIG. 2 is a schematic circuit diagram showing a partial configuration of the semiconductor storage device.

FIG. 1 is a block view showing a configuration of the semiconductor storage device according to a first embodiment. FIG. 2 is a circuit diagram showing a partial configuration of the semiconductor storage device.

As shown in FIG. 1, the semiconductor storage device includes a memory cell array MCA, a transistor array TA, a row decoder RD, a column decoder CD, an upper block decoder UB, a power supply VG, and a control circuit SQC.

As shown in FIG. 2, the memory cell array MCA includes a plurality of word lines WL, a plurality of local bit lines LBL, and a plurality of memory cells MC connected between the plurality of word lines WL and the plurality of local bit lines LBL. Each of the plurality of memory cells MC includes a variable-resistance element.

The transistor array TA includes a global bit line GBL, a plurality of selected transistors STr connected between the global bit line GBL and the plurality of local bit lines LBL, and a plurality of selected gate lines SG connected to the gate electrodes of the plurality of selected transistors STr.

The row decoder RD shown in FIG. 1 includes, for example, a word line decoding circuit and a selected gate line decoding circuit. The word line decoding circuit makes the word line WL specified by a row address RA conductive with a selected word line voltage supply line and makes the other word lines WL conductive with the non-selected word line voltage supply line. For example, the word line decoding circuit includes a plurality of AND circuits and a plurality of voltage transfer circuits provided corresponding to the plurality of word lines WL. The plurality of AND circuits are configured such that, for example, the AND circuit corresponding to the word line WL specified by the row address RA outputs "L", and the other AND circuits output "H". The voltage transfer circuit includes, for example, a voltage transfer transistor that makes the word lines WL conductive with the selected word line voltage supply line when "L" is input to the gate electrode, and a voltage transfer transistor that makes the word line WL conductive with the non-selected word line voltage supply line when "H" is input to the gate electrode. The selected gate line decoding circuit makes the selected gate line SG specified by the row address RA conductive with an ON voltage supply line and makes the other selected gate lines SG conductive with an OFF voltage supply line.

The column decoder CD shown in FIG. 1 includes, for example, a bit line decoding circuit. The bit line decoding circuit makes the global bit line GBL specified by a column address CA conductive with an output terminal of a column control circuit (not shown) and makes the other global bit lines GBL lines conductive with the non-selected bit line voltage supply lines. The column control circuit (not shown) includes a data buffer circuit, a sense amplifier circuit, and a selected bit line decoding circuit. The data buffer circuit latches read data or write data. The sense amplifier circuit detects the voltage or current applied to or flowing through the global bit line GBL and causes the data buffer circuit to latch the voltage or current as read data. The selected bit line decoding circuit makes the global bit line GBL conductive with the selected bit line voltage supply line or the non-selected bit line voltage supply line according to the data latched in the data buffer circuit.

The upper block decoder UB sequentially decodes address data latched in an address register (not shown), outputs the row address RA to the row decoder RD, and outputs the column address CA to the column decoder CD.

The power supply VG includes a plurality of step-down circuits such as a regulator for stepping down the power supply voltage. The output terminals of the plurality of step-down circuits are connected to a selected word line voltage supply line, a non-selected word line voltage supply line, an ON voltage supply line, an OFF voltage supply line, a selected bit line voltage supply line, a non-selected bit line voltage supply line, and other voltage supply lines. The plurality of step-down circuits adjust the output voltage according to an internal control signal.

The control circuit SQC sequentially decodes command data latched in a command register (not shown) and outputs the decoded command as an internal control signal to each component in the semiconductor storage device.

[Memory Cell Array MCA]

Figure 3:
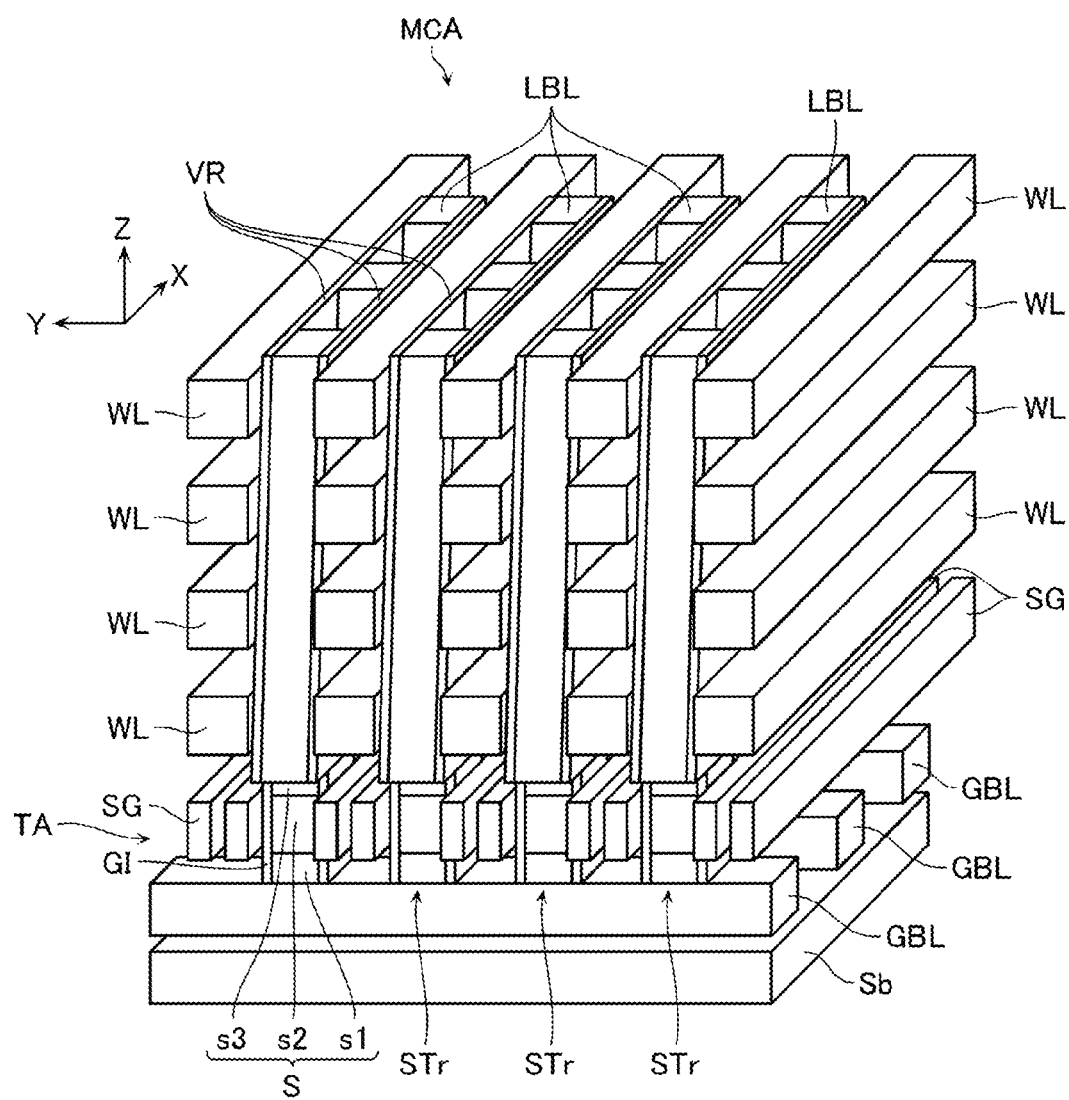
FIG. 3 is a schematic perspective view showing a partial configuration of the semiconductor storage device.
Figure 4:
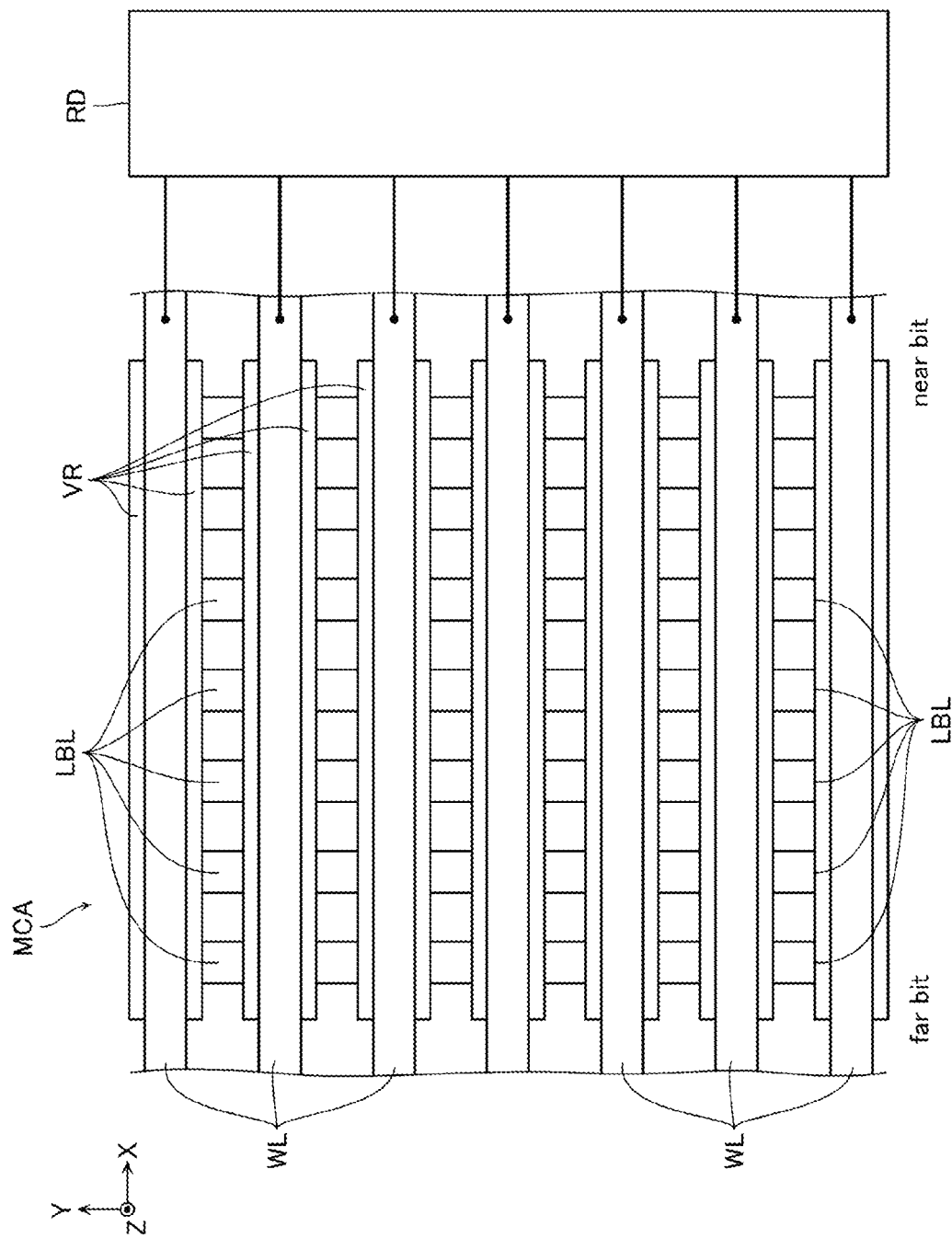
FIGS. 4 and 5 are schematic plan views each showing a partial configuration of the semiconductor storage device.
Figure 5:
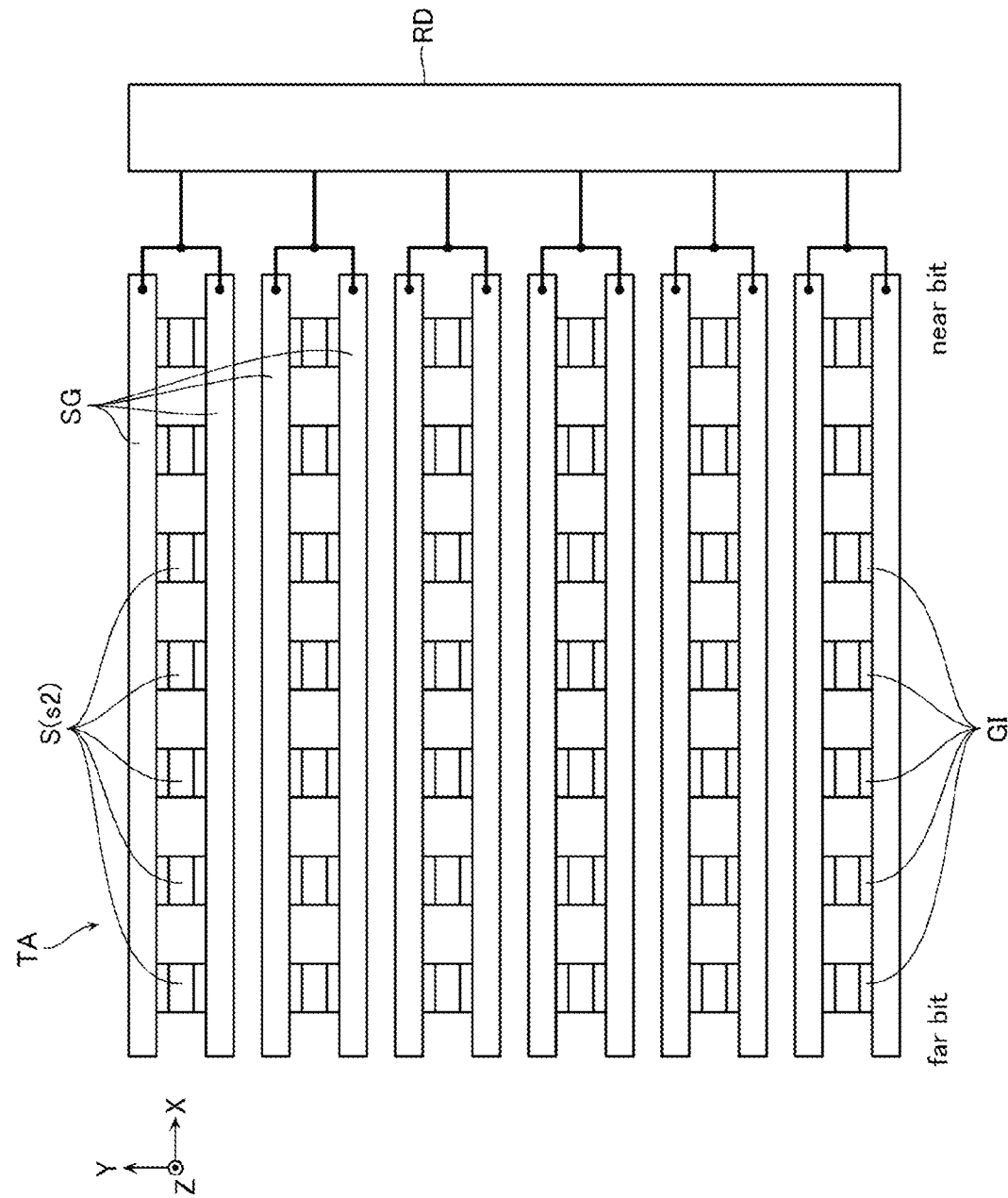

FIG. 3 is a schematic perspective view showing a configuration of the memory cell array MCA and the transistor array TA according to the present embodiment. FIG. 4 is a schematic XY cross-sectional view showing a partial configuration of the memory cell array MCA. FIG. 5 is a schematic XY cross-sectional view showing a partial configuration of the transistor array TA.

As shown in FIG. 3, the memory cell array MCA includes a plurality of word lines WL arranged in the Y direction and the Z direction and extending in the X direction, a plurality of local bit lines LBL arranged in the X direction and the Y direction and extending in the Z direction, and a plurality of variable resistance films VR provided between the word lines WL and the local bit lines LBL.

The word line WL and the local bit line LBL may include, for example, a stacked film of titanium nitride (TiN) and tungsten (W) or may include polycrystalline silicon (p-Si) into which impurities are implanted, silicide, or the like. An insulating layer (not shown) such as $SiO_2$ may be provided between these wirings.

A portion of the variable resistance film VR provided between the word line WL and the local bit line LBL functions as a variable-resistance element in the memory cell MC. Various configurations may be adopted as the variable resistance film VR.

For example, the variable resistance film VR may include a metal oxide or the like or may be one in which a filament such as an oxygen defect is formed in a metal oxide. In this case, the variable resistance film VR may include, for example, a metal oxide such as hafnium oxide ($HfO_x$), aluminum oxide ($AlO_x$), titanium oxide ($AlO_x$), or zirconium oxide ($ZrO_x$), may include a stacked film thereof, or may include a stacked film such as silver (Ag) or copper (Cu).

The variable resistance film VR may include, for example, chalcogenide or the like, and a part of the variable resistance film VR may be in a crystalline state or an amorphous state. In this case, the variable resistance film VR may include, for example, germanium (Ge), selenium (Se), tellurium (Te), or the like or may include other materials.

The variable resistance film VR may include, for example, a tunnel insulating film that functions as a ferroelectric film.

The ferroelectric film described in this specification may include, for example, tetragonal hafnium oxide. The hafnium oxide contained in the ferroelectric film may be mainly composed of tetragonal crystals. More specifically, the hafnium oxide contained in the ferroelectric film may be mainly composed of a third tetragonal crystal (i.e., orthorhombic III, space group Pbc21, space group number 29). In the hafnium oxide crystals contained in the ferroelectric film, the proportion of tetragonal crystals may be the largest. Tetragonal crystals are also called orthorhombic crystals.

The ferroelectric film described in this specification may include at least one additive element selected from the group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba).

From the viewpoint of developing the ferroelectricity of the hafnium oxide, the concentration of the additive element is preferably in the range of 0.1 atom % or more to 60% or less. An appropriate range of the concentration of the additive element for developing the ferroelectricity of the hafnium oxide varies depending on the kind of the additive element. For example, when the additive element is silicon (Si), an appropriate range of the concentration of the additive element for developing ferroelectricity is 3 atom % or more to 7 atom % or less. For example, when the additive element is barium (Ba), an appropriate range of the concentration of the additive element for developing ferroelectricity is 0.1 atom % or more to 3 atom % or less. For example, when the additive element is zirconium (Zr), an appropriate range of the concentration of the additive element for developing ferroelectricity is 10 atom % or more to 60 atom % or less.

The word line WL according to the present embodiment is connected to the row decoder RD on one end side in the X direction (i.e., the right side in FIG. 4). Accordingly, some local bit lines LBL are relatively far from the connecting portion between the word line WL and the row decoder RD. On the other hand, some local bit lines LBL are relatively close to connecting portion between the word line WL and the row decoder RD. Hereinafter, when focusing on the local bit line LBL, the memory cell MC, or the selected transistor STr, the side where the connecting portion is located between the word line WL and the row decoder RD in the X direction (i.e., the right side in FIG. 4) is sometimes referred to as "near bit side" or the like. The opposite side of the near bit side (i.e., the left side in FIG. 4) may be referred to as "far bit side" or the like.

[Transistor Array TA]

For example, as shown in FIG. 3, the transistor array TA includes a plurality of global bit lines GBL arranged in the X direction and extending in the Y direction, a plurality of selected transistors STr arranged in the X direction and the Y direction, and a plurality of selected gate lines SG arranged in the Y direction and extending in the X direction.

The selected transistors STr are arranged in the X direction and the Y direction corresponding to the local bit line LBL and are connected to the local bit line LBL. The selected transistor STr includes a semiconductor portion S, a gate insulating film GI provided between the semiconductor portion S and the selected gate line SG, and a part of the selected gate line SG.

The semiconductor portion S of the selected transistor STr includes an n-type semiconductor region s1 connected to the global bit line GBL, an n-type semiconductor region s3 connected to the local bit line LBL, and a p-type semiconductor region s2 provided therebetween. The semiconductor portion S may include, for example, polycrystalline silicon (Si). In this case, the n-type semiconductor regions s1 and s3 contain N-type impurities such as phosphorus (P). The p-type semiconductor region s2 contains a P-type impurity such as boron (B). The semiconductor portion S may include an oxide semiconductor such as a metal oxide, for example. In such a case, the n-type semiconductor regions s1 and s3 may contain indium (In), gallium (Ga), zinc (Zn), oxygen (O), and the like. The p-type semiconductor region s2 may contain copper (Cu) and oxygen (O) or may contain tin (Sn) and oxygen (O).

The gate insulating film GI of the selected transistor STr contains, for example, silicon oxide ($SiO_2$) or hafnium oxide ($HfO_x$).

The selected gate lines SG are arranged in the Y direction corresponding to the selected transistors STr and extend in the X direction. The selected gate line SG faces the p-type semiconductor regions s2 of a plurality of semiconductor portions S arranged in the X direction. The selected gate line SG functions as a gate electrode of the selected transistor STr. The shape and the like of the selected gate line SG may be adjusted as appropriate. For example, the selected gate line SG may have a plurality of through holes that face the outer peripheral surfaces of the plurality of semiconductor portions S. For example, as shown in FIG. 5, the selected gate line SG may include two members that face one side surface and the other side surface of the semiconductor portion S in the Y direction.

The selected gate line SG and the global bit line GBL may contain, for example, materials applicable to the word line WL and the local bit line LBL. An insulating layer (not shown) such as $SiO_2$ may be provided between the selected gate line SG and the global bit line GBL.

The configuration of the transistor array TA shown in FIGS. 3 and 5 is a schematic view for description and does not show a specific configuration. A configuration of the transistor array TA according to the present embodiment will be described later with reference to FIGS. 14 to 22.

[Operation]

Figure 6:
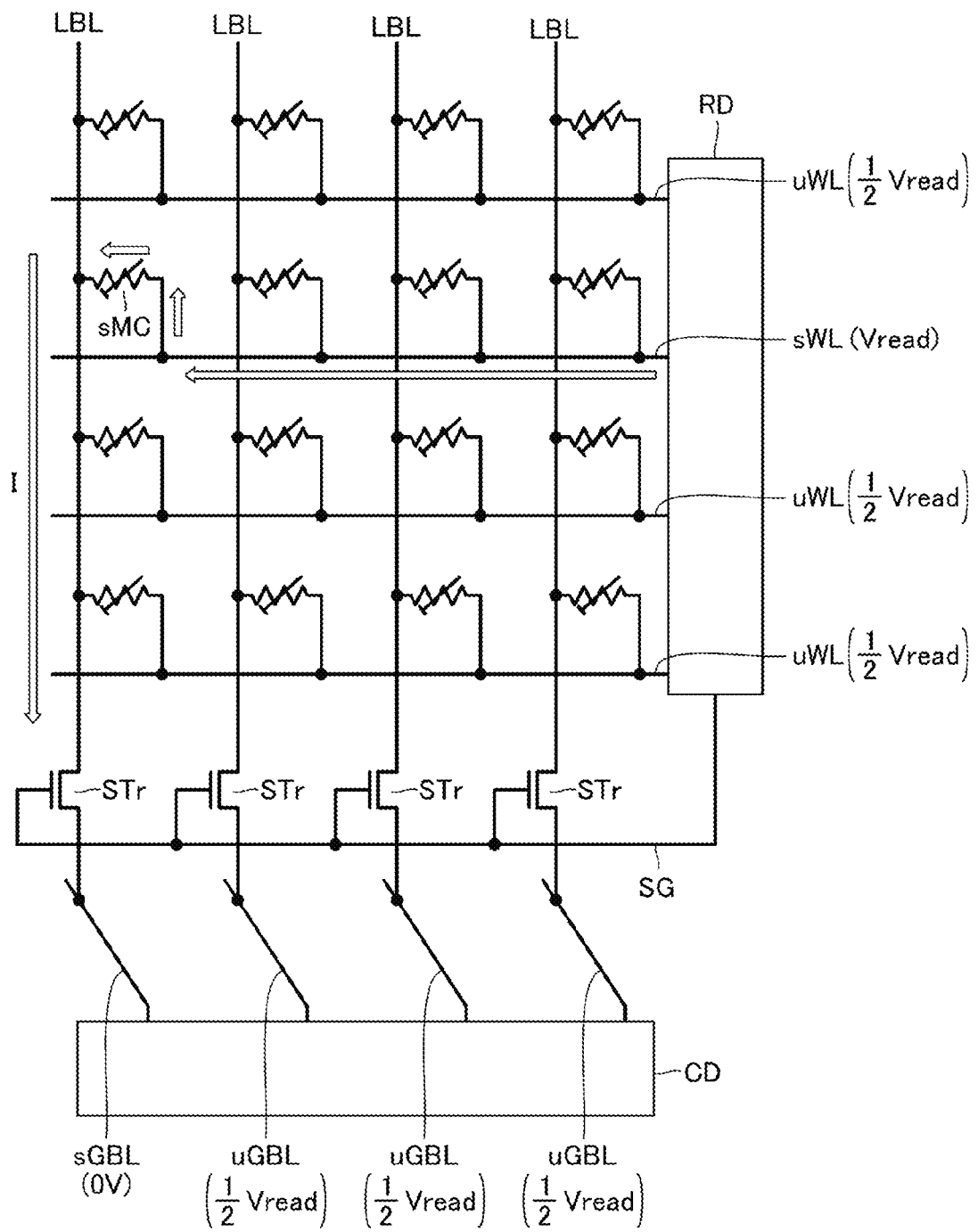
FIG. 6 is a schematic circuit diagram for explaining a read operation of the semiconductor storage device.
Figure 7:
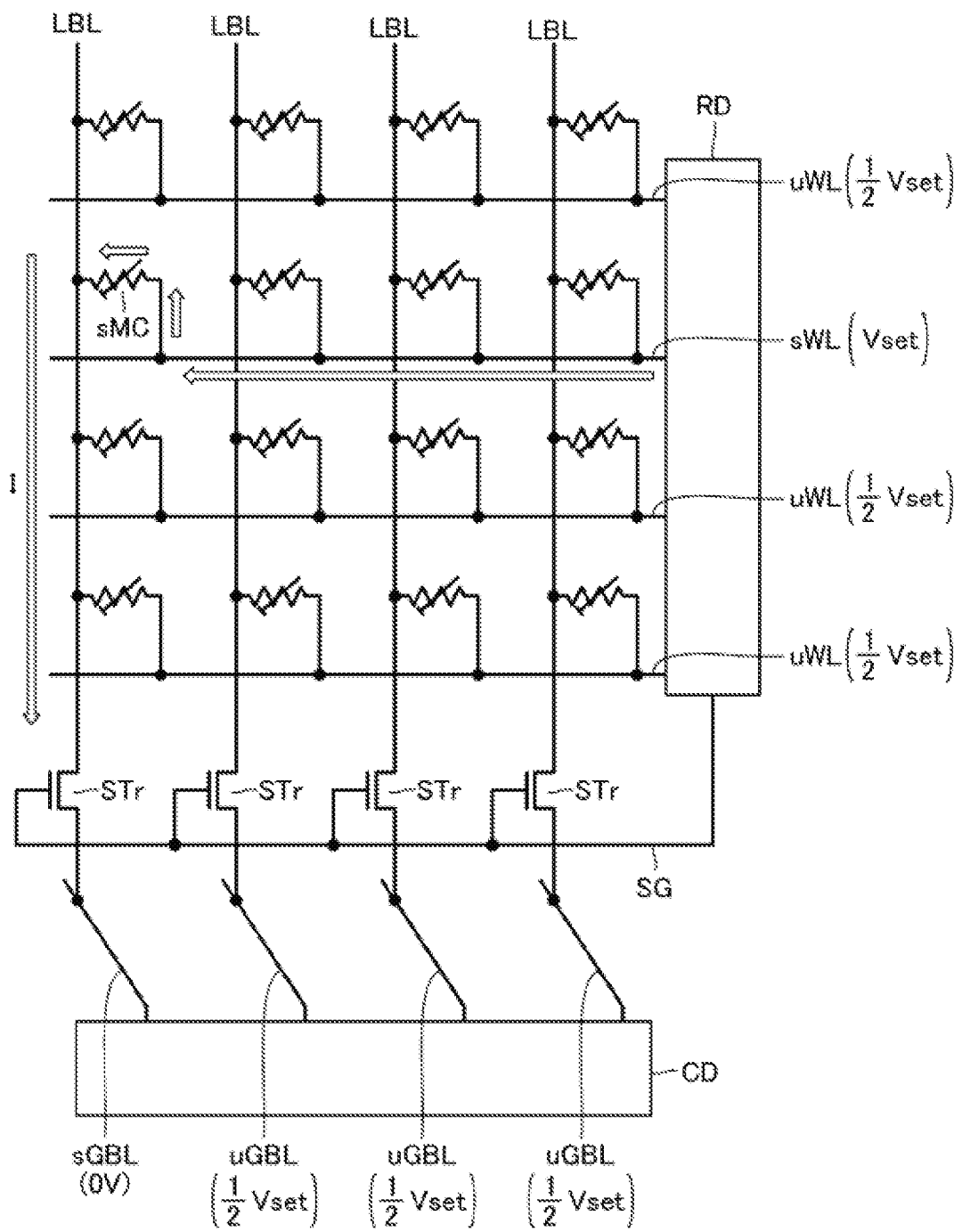
FIG. 7 is a schematic circuit diagram for explaining a set operation of the semiconductor storage device.
Figure 8:
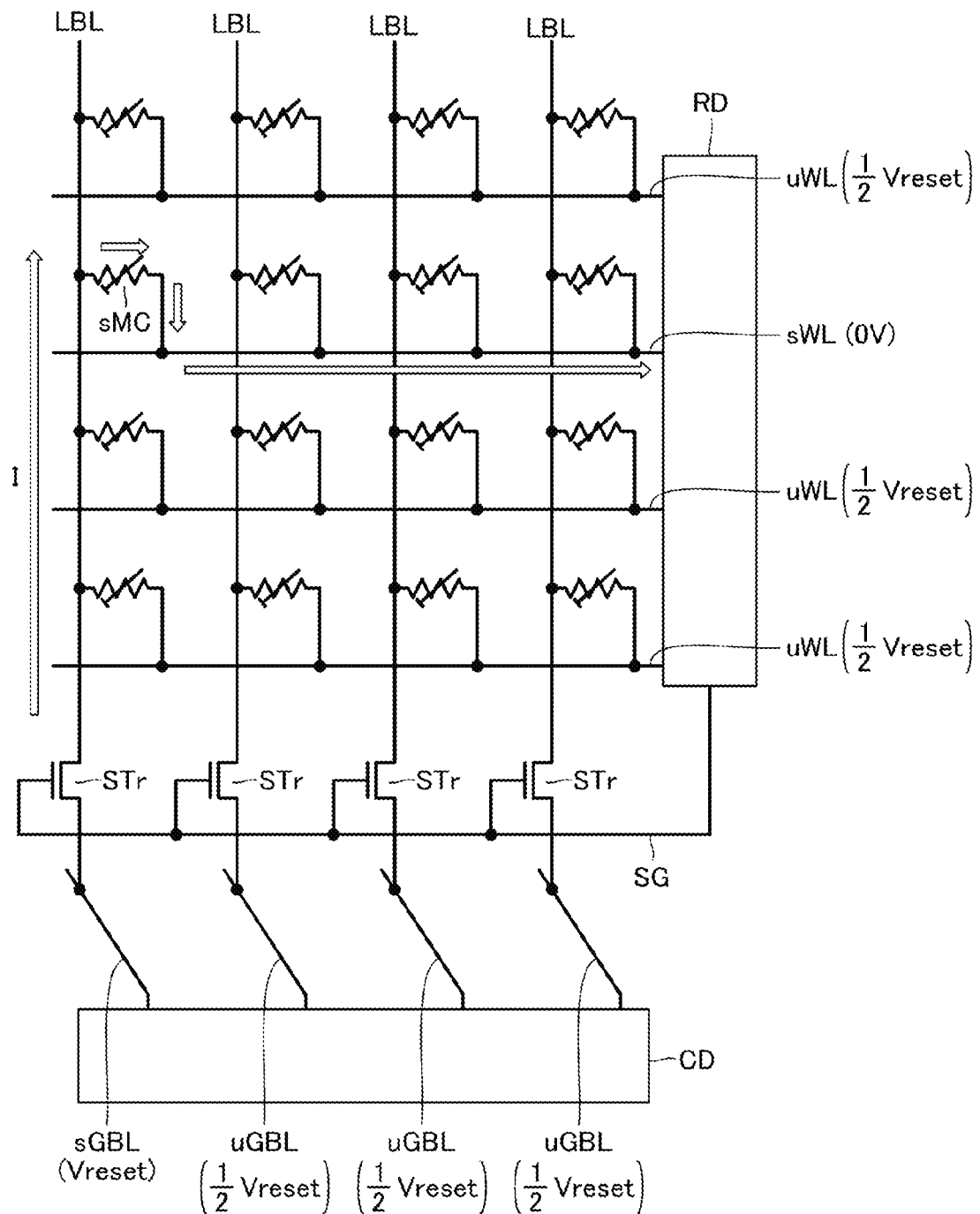
FIG. 8 is a schematic circuit diagram for explaining a reset operation of the semiconductor storage device.

Next, the operation of the semiconductor storage device according to the present embodiment will be described with reference to FIGS. 6 to 8. FIGS. 6 to 8 are schematic circuit diagrams for explaining the operation of the semiconductor storage device according to the present embodiment.

As shown in FIG. 6, in a read operation, a voltage Vread is supplied to a selected word line sWL. For example, the voltage Vread is generated by the power supply VG shown in FIG. 1 and output to the selected word line voltage supply line. The row decoder shown in FIG. 1 makes the selected word line sWL and the selected word line voltage supply line conductive. In the read operation, the voltage ½ Vread is supplied to a non-selected word line uWL, 0V is supplied to a selected global bit line sGBL, and the voltage ½ Vread is supplied to a non-selected bit line uGBL. The selected gate line SG corresponding to a selected memory cell sMC is supplied with an ON voltage at which the selected gate line SG is turned on, and the other selected gate lines SG are supplied with an OFF voltage at which the selected gate line SG is turned off. Thereby, when the selected memory cell sMC is in a set state (i.e., a low resistance state), a current I flows from the selected word line sWL to the selected global bit line sGBL. When the selected memory cell sMC is in a reset state (i.e., a high resistance state), the current I does not flow.

In the read operation, the sense amplifier circuit detects the voltage or current applied to or flowing through the selected global bit line sGBL, causes the data buffer circuit to latch the detected data as read data, and outputs the read data to the outside of the semiconductor storage device.

As shown in FIG. 7, in a set operation, a voltage Vset is supplied to the selected word line sWL, the voltage ½ Vset is supplied to the non-selected word line uWL, 0V is supplied to the selected global bit line sGBL, and the voltage ½ Vset is supplied to the non-selected bit line uGBL. The voltage Vset is larger than the voltage Vread. An ON voltage is supplied to the selected gate line SG corresponding to the selected memory cell sMC, and an OFF voltage is supplied to the other selected gate lines SG. As a result, the state of the selected memory cell sMC is set to the set state (i.e., the low resistance state).

As shown in FIG. 8, in a reset operation, 0V is supplied to the selected word line sWL, a voltage ½ Vreset is supplied to the non-selected word line uWL, a voltage Vreset is supplied to the selected global bit line sGBL, and the voltage ½ Vreset is supplied to the non-selected bit line uGBL. The voltage Vreset is larger than the voltage Vset. An ON voltage is supplied to the selected gate line SG corresponding to the selected memory cell sMC, and an OFF voltage is supplied to the other selected gate lines SG. As a result, the state of the selected memory cell sMC is set to the reset state (i.e., the high resistance state).

[Wiring Resistance of Word Line WL]

As the semiconductor storage device is highly integrated, the width of the word line WL (i.e., the length in the Y direction and the Z direction, see FIGS. 3 and 4) is decreasing. Along with this, the wiring resistance in the word line WL is increasing, and the voltage drop in the word line WL in the read operation or the like is increasing. Therefore, for example, when the memory cell MC located closest to the near bit side is referred to as the memory cell MCn, and the memory cell MC located closest to the far bit side is referred to as the memory cell MCf, the voltage required for executing the read operation of the memory cell MCn and the voltage required for executing the read operation of the memory cell MCf are different.

Figure 9:
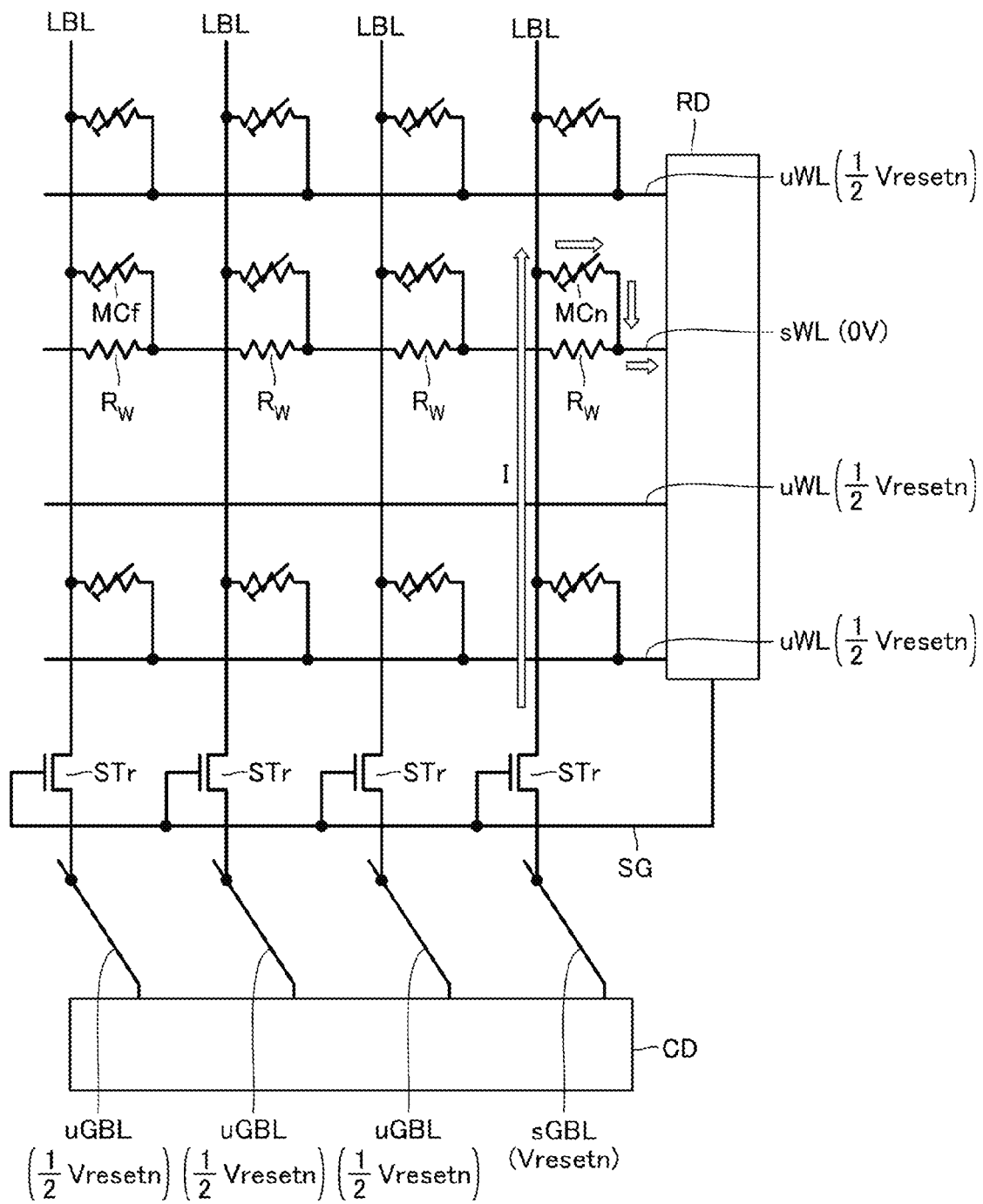
FIG. 9 is a schematic circuit diagram showing a state of the reset operation for a memory cell MCn.
Figure 10:
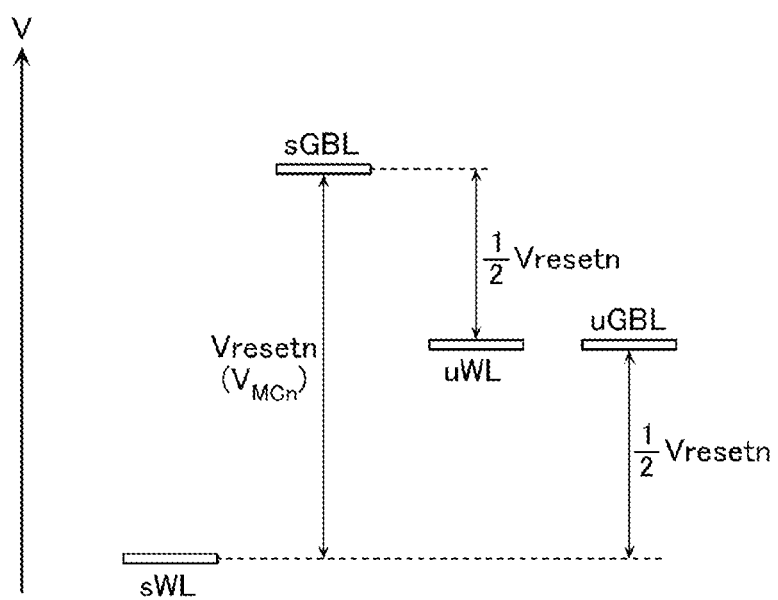
FIG. 10 is a schematic diagram showing a voltage applied to the memory cell MCn.

For example, as shown in FIGS. 9 and 10, when the reset operation is executed with the memory cell MCn as the selected memory cell sMC, a voltage Vresetn is supplied to the selected global bit line sGBL, and a voltage 0V is supplied to the selected word line sWL. As a result, the current I flows from the selected global bit line sGBL to the selected word line sWL, and a voltage drop occurs due to the wiring resistance of the selected word line sWL. However, since the distance from the memory cell MCn to the row decoder RD is sufficiently short, the voltage drop in the selected word line sWL is sufficiently small. Accordingly, a voltage $V_{MCn}$ applied to the memory cell MCn is approximately equal to the voltage Vresetn.

Figure 11:
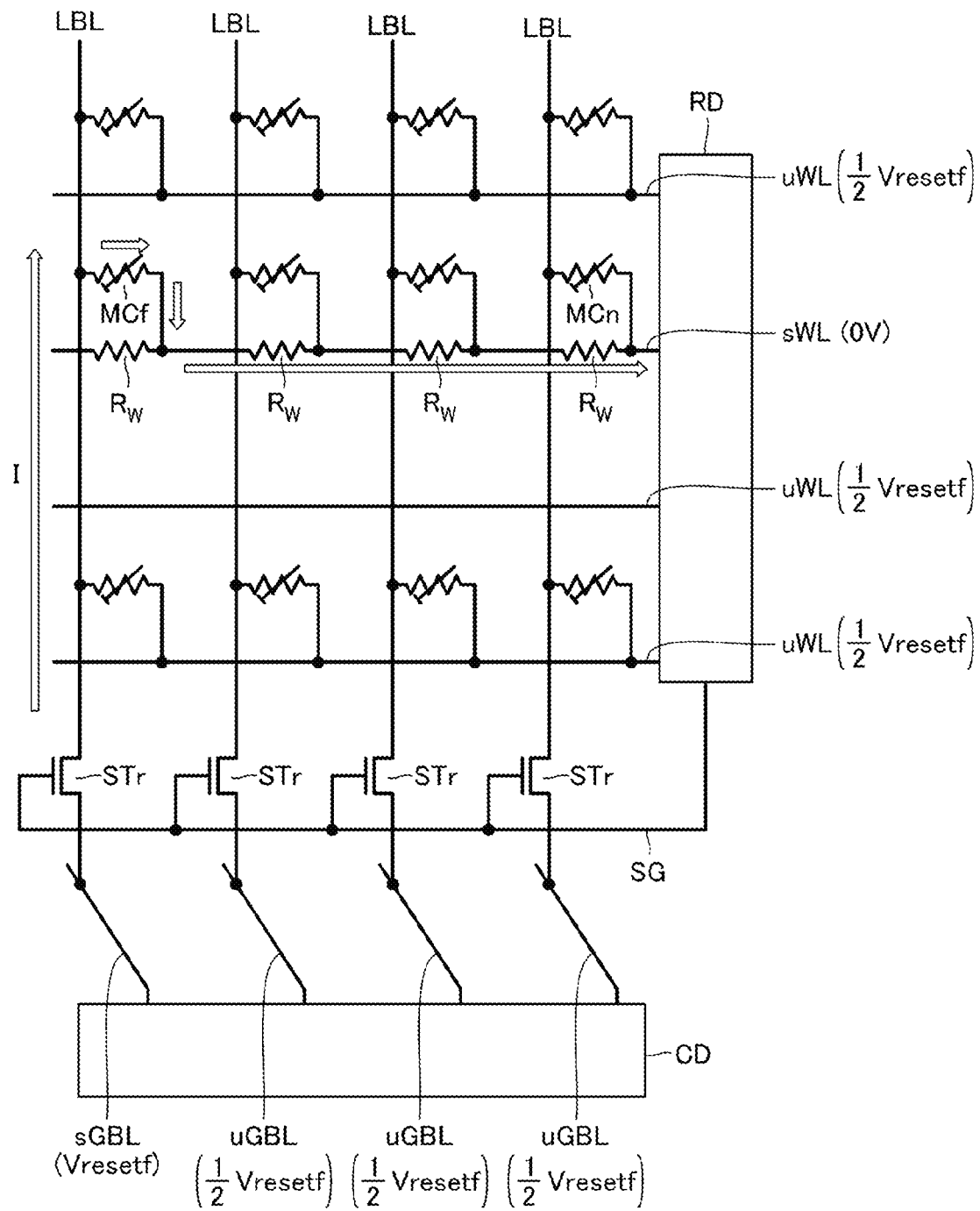
FIG. 11 is a schematic circuit diagram showing a state of the reset operation for a memory cell MCf.
Figure 12:
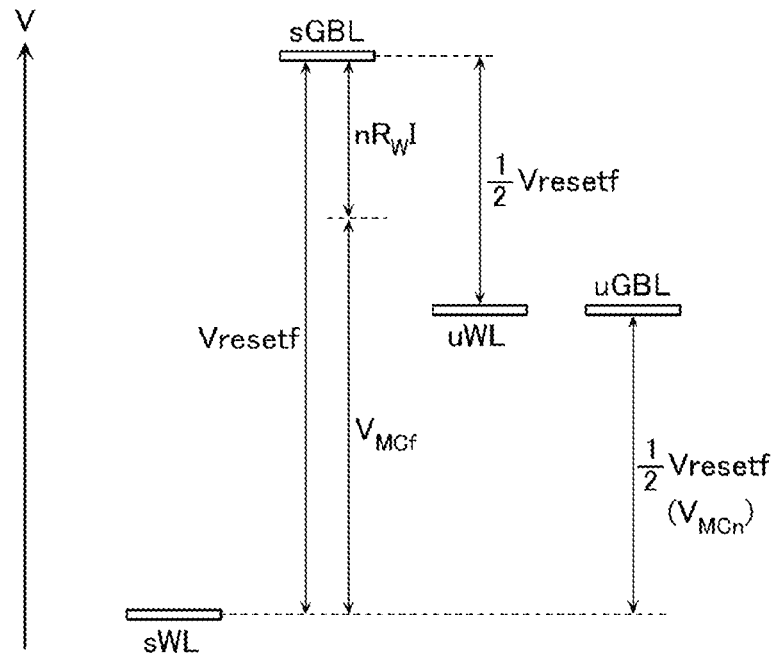
FIG. 12 is a schematic diagram showing voltages applied to the memory cells MCn and MCf.

On the other hand, for example, as shown in FIGS. 11 and 12, when the reset operation is executed with the memory cell MCf as the selected memory cell sMC, a voltage Vresetf is supplied to the selected global bit line sGBL, and a voltage 0V is supplied to the selected word line sWL. As a result, the current I flows from the selected global bit line sGBL to the selected word line sWL, and a voltage drop nRwI occurs due to the wiring resistance of the selected word line sWL. Here, since the distance from the memory cell MCf to the row decoder RD is relatively long, the voltage drop nRwI in the selected word line sWL becomes relatively large. Accordingly, a voltage $V_{MCf}$ applied to the memory cell MCf is obtained by subtracting the voltage drop nRwI at the selected word line sWL from the voltage Vresetf.

Here, in order to set the memory cell MCf to the reset state, it is desirable that the voltage $V_{MCf}$ applied to the memory cell MCf is approximately equal to the voltage Vresetn. Therefore, the voltage Vresetf needs to be set larger than the voltage Vresetn. However, when the voltage Vresetf is set to be large, not only the voltage $V_{MCf}$ applied to the memory cell MCf but also the voltage $V_{MCn}$ applied to the non-selected memory cell MC is increased. In particular, a large voltage $V_{MCn}$ is applied to the memory cell MCn, which may also cause the memory cell MCn to be reset, and data stored in the memory cell MCn is lost. Hereinafter, such loss of data may be referred to as "disturbance".

[Configuration Example of Transistor Array TA]

Figure 13:
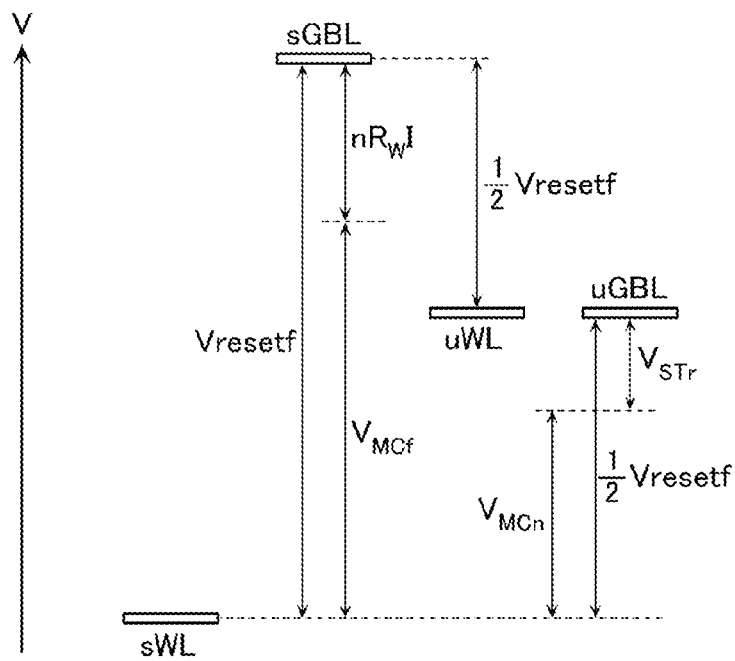
FIG. 13 is a schematic diagram showing voltages applied to the memory cells MCn and MCf in the reset operation of the semiconductor storage device according to the first embodiment.

The transistor array TA according to the present embodiment prevents the occurrence of the disturbance. That is, the transistor array TA according to the present embodiment is configured such that the selected transistor STr located at the near bit side has a larger voltage division in the reset operation and the selected transistor STr located at the far bit side has a smaller voltage division in the reset operation and the like. Thus, for example, as shown in FIG. 13, in the reset operation of the memory cell MCf, the voltage $V_{STr}$ applied to the selected transistor Str connected to the memory cell MCn can be increased, and the voltage $V_{MCn}$ applied to the memory cell MCn can be decreased.

Hereinafter, as methods for configuring the transistor array TA in this way, a method for adjusting the channel width of the selected transistor STr, a method for adjusting the amount or concentration of impurities such as boron (B) in the p-type semiconductor region s2 of the semiconductor portion S of the selected transistor STr, and a method for adjusting the strength of the electric field applied to the p-type semiconductor region s2 of the selected transistor STr are exemplified.

[Transistor Array TA_A]

Figure 14:
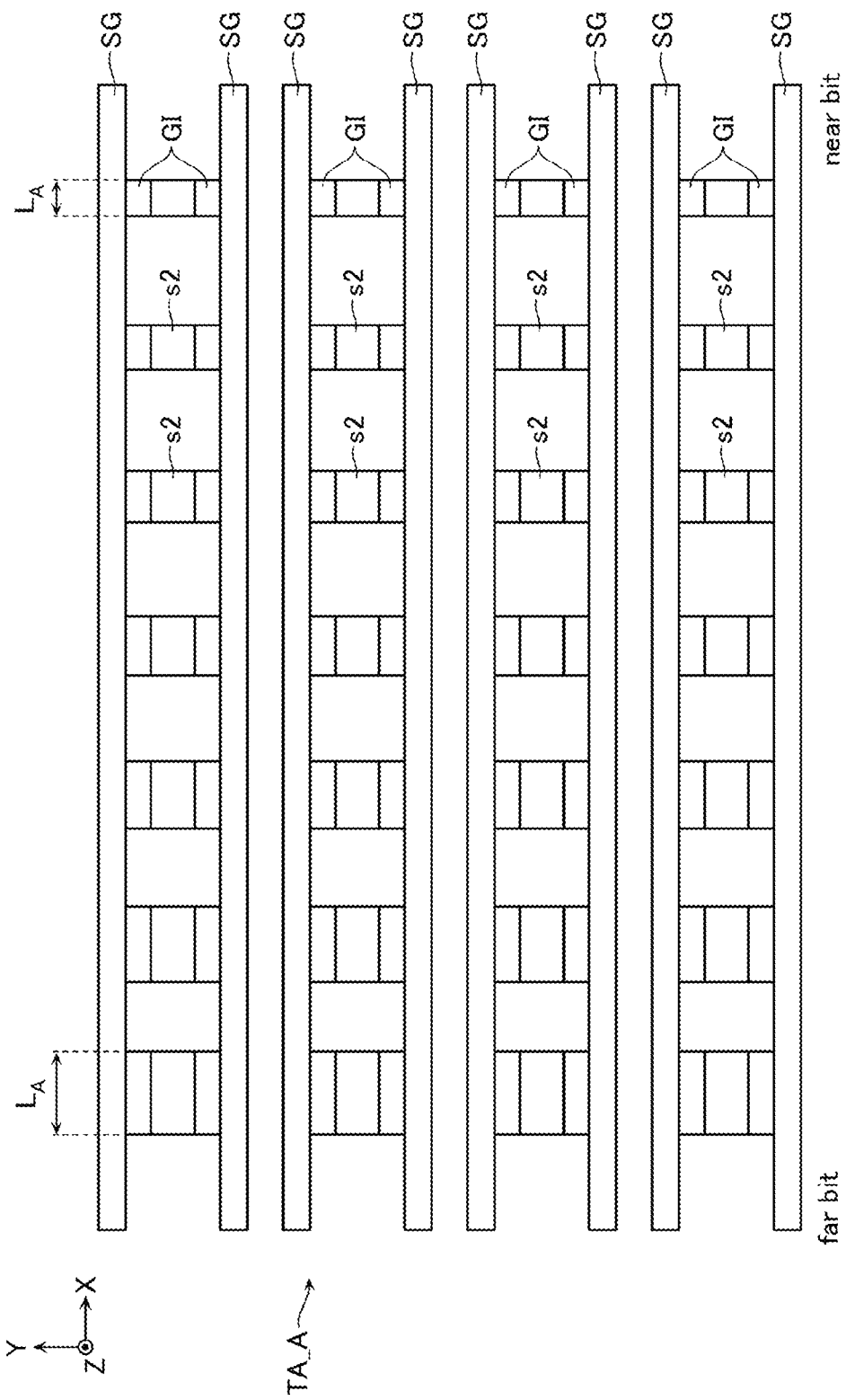
FIGS. 14-22 are schematic plan views each showing a configuration of a transistor array TA of the same semiconductor storage device.

FIG. 14 is a schematic XY cross-sectional view showing a configuration of a transistor array TA_A according to a first configuration example. The transistor array TA_A is basically configured as described with reference to FIG. 3. However, in the transistor array TA_A, the selected transistor STr provided at the near bit side has a smaller length $L_A$ in the X direction of the p-type semiconductor region s2 of the semiconductor portion S and a smaller facing area of the selected gate line SG. The selected transistor STr provided at the far bit side has a larger length LA in the X direction of the p-type semiconductor region s2 of the semiconductor portion S, and has a larger facing area of the selected gate line SG.

The "facing area" here means, for example, the area of the facing surface that faces the selected gate line SG in the outer peripheral surface of the p-type semiconductor region s2. The area of this facing surface is determined by, for example, observing a cross section including a plurality of selected gate lines SG and a plurality of p-type semiconductor regions s2 by Scanning Electron Microscope (SEM), Transmission Electron Microscope (TEM), and the like and calculating the length of the portion corresponding to the facing surface in the contour line of the p-type semiconductor region s2. For example, a portion of the contour line of the p-type semiconductor region s2 of which distance to the selected gate line SG is about the shortest distance or about the thickness of the gate insulating film GI corresponds to the facing surface.

According to such a configuration, the selected transistor STr provided at the near bit side has a smaller channel width of the electron channel (i.e., the inversion layer) formed in the semiconductor portion S, and the voltage division when the voltage Vreset or the like is supplied increases. Thereby, occurrence of the disturbance can be prevented.

In the example of FIG. 14, the plurality of p-type semiconductor regions s2 arranged in the X direction all have different lengths LA. However, such a configuration is merely an example. For example, in a transistor array TA_A' shown in FIG. 15, the plurality of selected transistors STr adjacent in the X direction are grouped into a plurality of groups $G_{A1}$, $G_{A2}$, and $G_{A3}$. The p-type semiconductor region s2 in the group provided at the near bit side (i.e., the group $G_{A3}$) has a smaller length $L_A$ in the X direction, and the p-type semiconductor region s2 provided at the far bit side (i.e., the group $G_{A1}$) has a larger length $L_A$. The plurality of p-type semiconductor regions s2 in the same group have the same length $L_A$.

Figure 15:
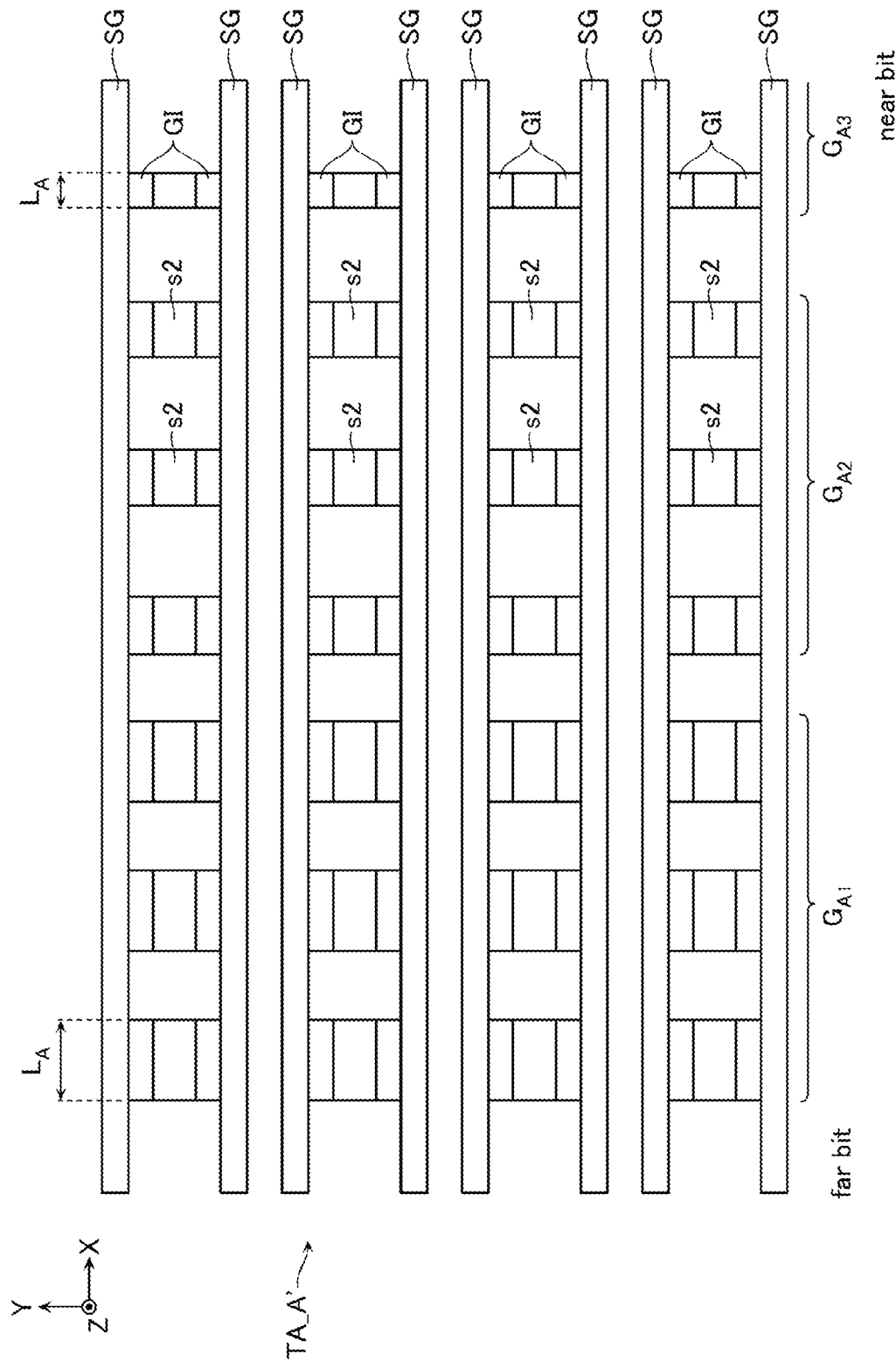

In the example of FIGS. 14 and 15, all the gate insulating films GI are independent for each selected transistor STr. However, the plurality of gate insulating films GI arranged in the X direction may be connected to each other.

[Transistor Array TA_B]

Figure 16:
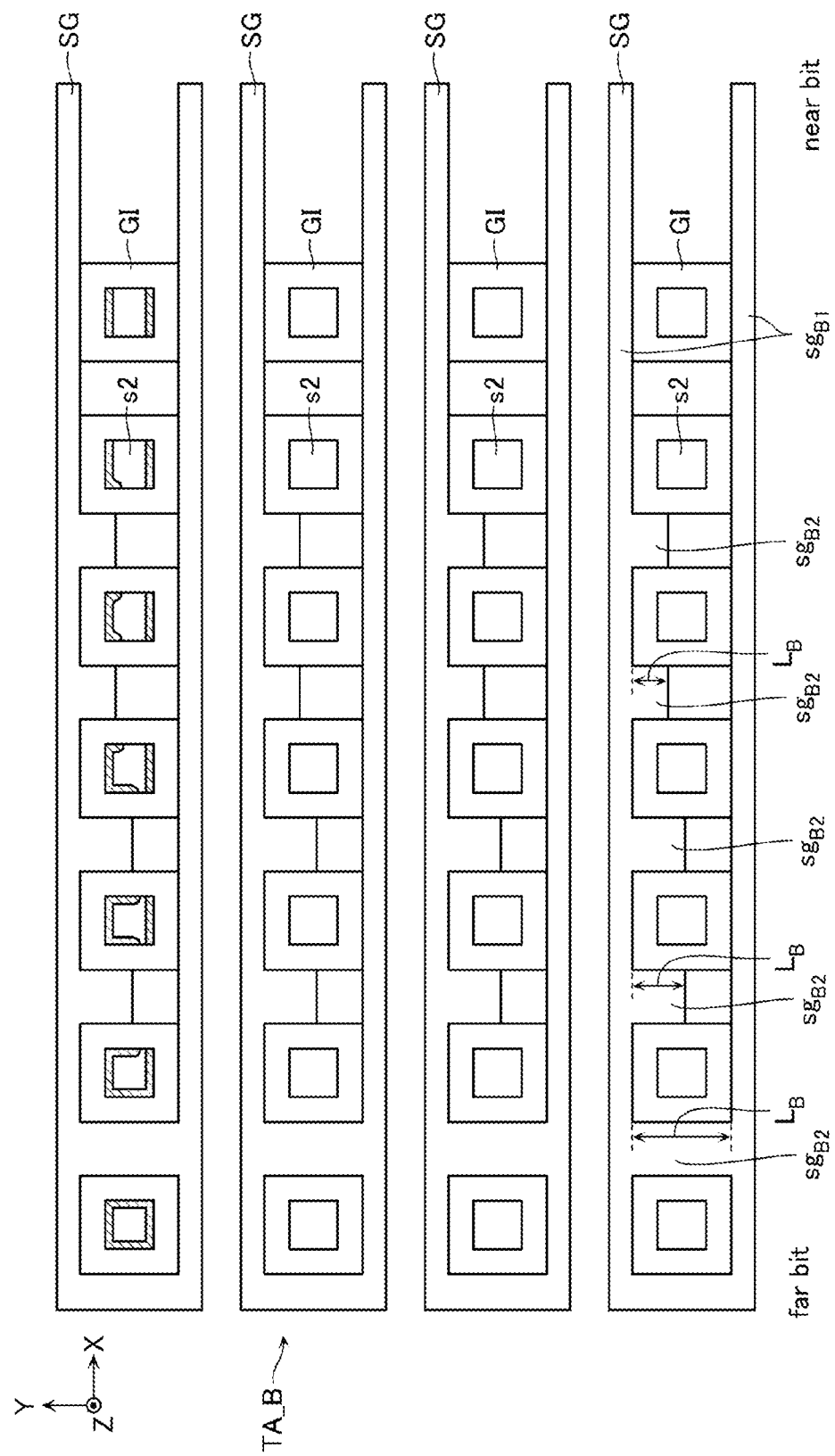
Figure 17:
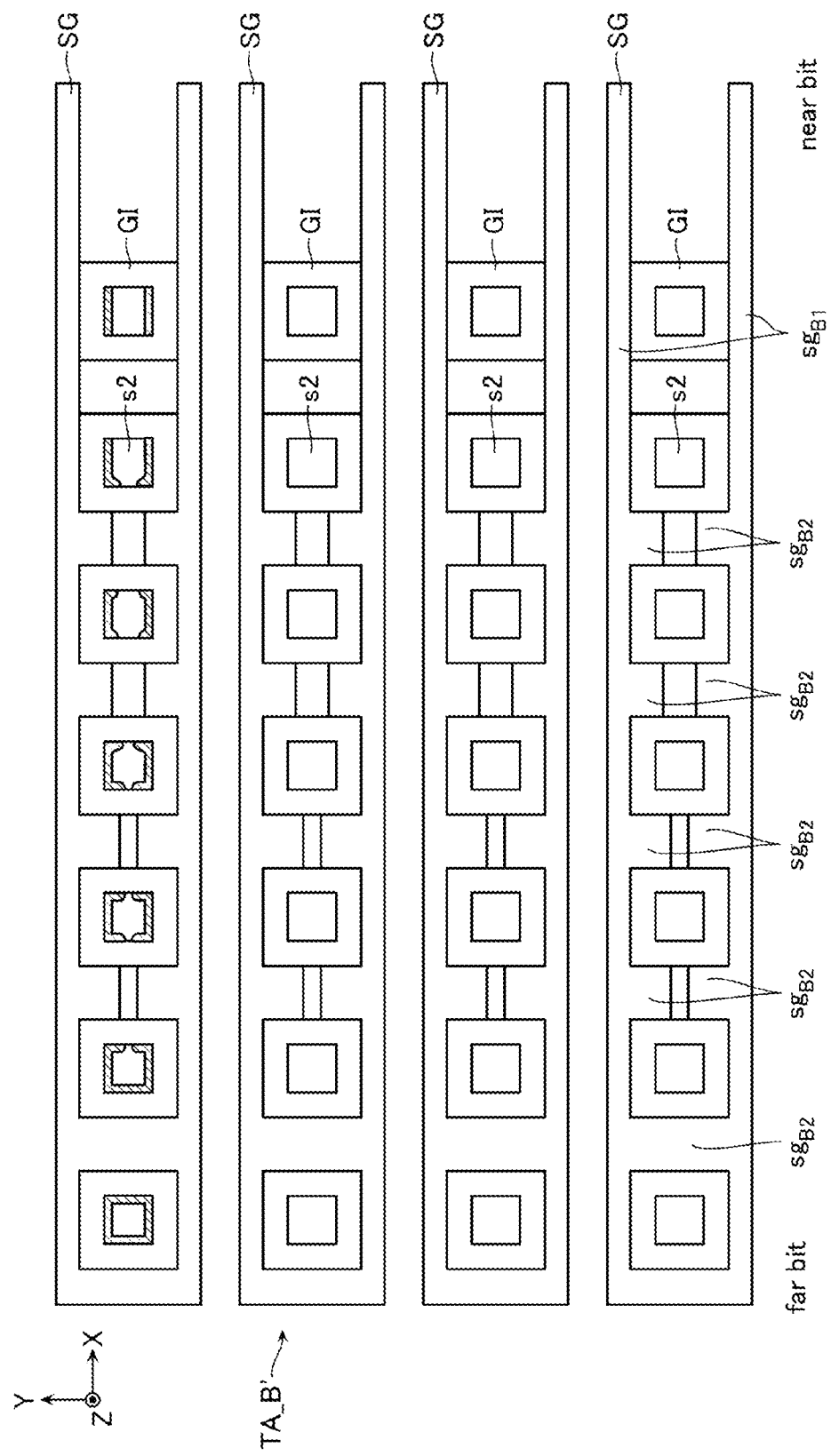

FIG. 16 is a schematic XY cross-sectional view showing a configuration of a transistor array TA_B according to a second configuration example. The transistor array TA_B is basically configured as described with reference to FIG. 3. However, in the transistor array TA_B, the selected transistor STr provided at the near bit side has a smaller facing area of the selected gate line SG. The selected transistor STr provided at the far bit side has a larger facing area of the selected gate line SG.

That is, the selected gate line SG of the transistor array TA_B includes a pair of Y gate electrode portions $sg_{B1}$ extending in the X direction and facing the p-type semiconductor region s2 of the semiconductor portion S from the Y direction, and a plurality of X gate electrode portions $sg_{B2}$ connected to at least one of the pair of Y gate electrode portions $sg_{B1}$ and facing the p-type semiconductor region s2 of the semiconductor portion S from the X direction. The X gate electrode portion $sg_{B2}$ provided at the near bit side has a smaller length $L_B$ in the Y direction, and the X gate electrode portion $sg_{B2}$ provided at the far bit side is a larger length $L_B$ in the Y direction. In the illustrated example, two X gate electrode portions $sg_{B2}$ provided at the closest to far bit side are connected to both of two Y gate electrode portions $sg_{B1}$ arranged in the Y direction. The other X gate electrode portion $sg_{B2}$ is connected to one of the two Y gate electrode portions $sg_{B1}$ arranged in the Y direction. The X gate electrode portion $sg_{B2}$ is not provided between the two p-type semiconductor regions s2 provided on the nearest bit side.

According to such a configuration, the selected transistor STr provided at the near bit side has a smaller channel width of the electron channel formed in the semiconductor portion S, and the voltage division when the voltage Vreset or the like is supplied increases. Thereby, occurrence of the disturbance can be prevented.

In the example of FIG. 16, the facing areas of the selected gate lines SG of the plurality of p-type semiconductor regions s2 arranged in the X direction are all different. However, such a configuration is merely an example. For example, the plurality of selected transistors STr adjacent in the X direction may be grouped into a plurality of groups, and the plurality of selected transistors STr in the same group may have the same configuration.

In the example of FIG. 16, one X gate electrode portion $sg_{B2}$ is provided between two semiconductor portions S arranged in the X direction. However, such a configuration is merely an example. For example, in a transistor array TA_B' shown in FIG. 17, two X gate electrode portions $sg_{B2}$ arranged in the Y direction are provided between the two semiconductor portions S arranged in the X direction.

[Transistor Array TA_C]

Figure 18:
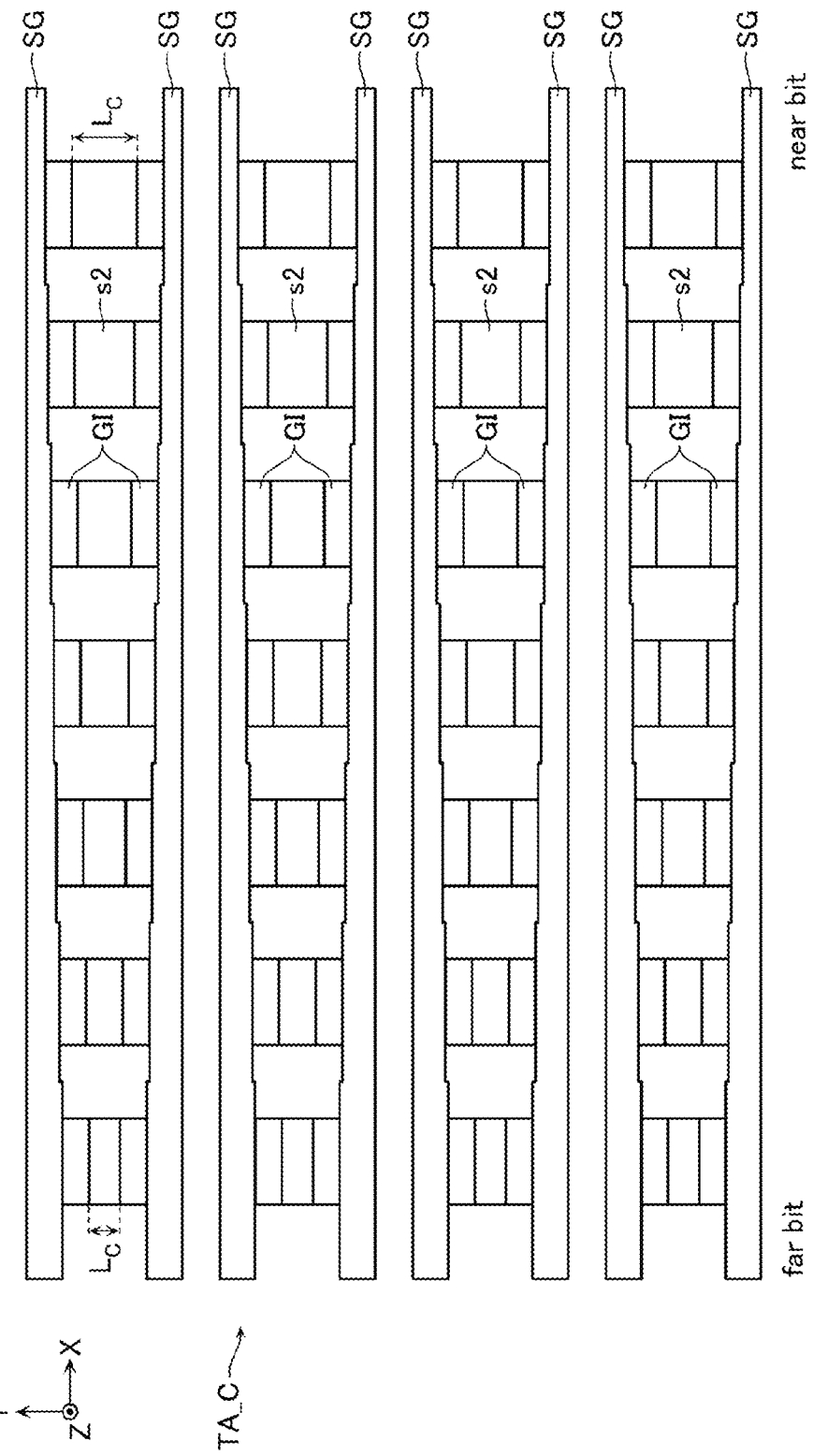

FIG. 18 is a schematic XY cross-sectional view showing a configuration of a transistor array TA_C according to a third configuration example. The transistor array TA_C is basically configured as described with reference to FIG. 3. However, in the transistor array TA_C, the selected transistor STr provided at the near bit side has a larger length $L_C$ in the Y direction of the p-type semiconductor region s2 of the semiconductor portion S. The selected transistor STr provided at the far bit side has a smaller length $L_C$ in the Y direction of the p-type semiconductor region s2 of the semiconductor portion S.

Here, the selected transistor STr having the semiconductor region S including polycrystalline silicon as a channel region is different from, for example, a transistor having the surface of a semiconductor substrate as a channel region, and has a small volume of the p-type semiconductor region s2 functioning as a channel region. In such the selected transistor STr, not only impurities such as boron contained in the surface of the p-type semiconductor region s2, but also impurities such as boron contained in the entire p-type semiconductor region s2 affect the characteristics of the selected transistor STr. For example, in the example of the transistor array TA_C in FIG. 18, the selected transistor STr provided at the near bit side has a larger length $L_C$ in the Y direction of the p-type semiconductor region s2 of the semiconductor portion S. Therefore, the p-type semiconductor region s2 provided at the near bit side contains a larger amount of impurities, making it difficult to form a channel. Accordingly, the selected transistor STr provided at the near bit side increases the voltage division when the voltage Vreset or the like is supplied. Thereby, occurrence of the disturbance can be prevented.

In the example of FIG. 18, the plurality of p-type semiconductor regions s2 arranged in the X direction all have different lengths LC. However, such a configuration is merely an example. For example, the plurality of selected transistors STr adjacent in the X direction may be grouped into a plurality of groups, and the plurality of selected transistors STr in the same group may have the same configuration.

In the example of FIG. 18, all the gate insulating films GI are independent for each selected transistor STr. However, the plurality of gate insulating films GI arranged in the X direction may be connected to each other.

[Transistor Array TA_D]

Figure 19:
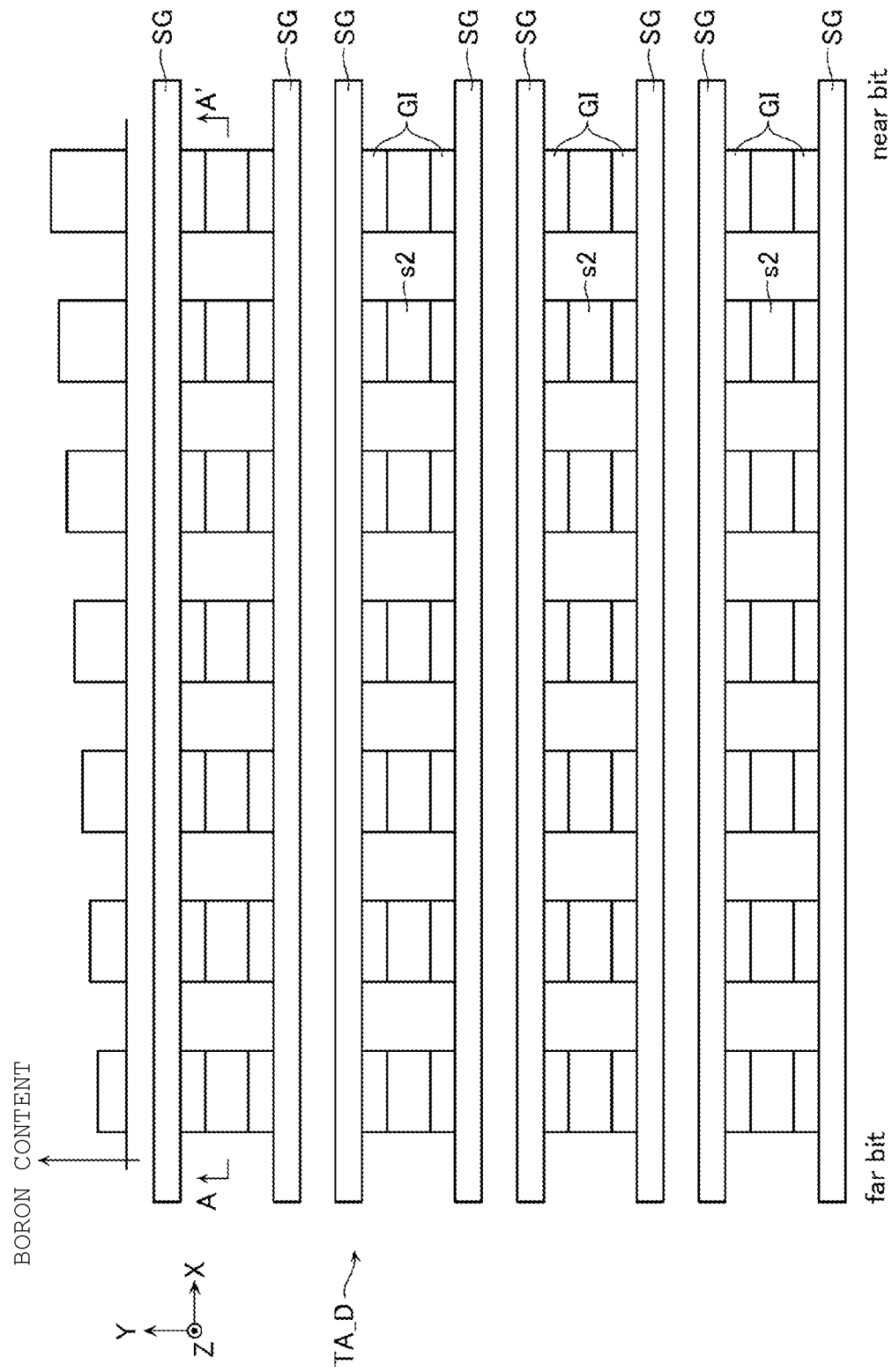

FIG. 19 is a schematic XY sectional view showing a configuration of a transistor array TA_D according to a fourth configuration example. FIG. 19 includes a schematic graph showing the relationship between the position on the A-A' line in the XY cross section and the concentration of impurities such as boron at this position. The transistor array TA_D is basically configured as described with reference to FIG. 3. However, in the transistor array TA_D, the selected transistor STr provided at the near bit side has a higher impurity concentration in the p-type semiconductor region s2 of the semiconductor portion S. The selected transistor STr provided at the far bit side has a lower impurity concentration in the p-type semiconductor region s2 of the semiconductor portion S.

According to such a configuration, the p-type semiconductor region s2 provided at the near bit side contains a larger amount of impurities, making it difficult to form a channel. Accordingly, the selected transistor STr provided at the near bit side increases the voltage division when the voltage Vreset or the like is supplied. Thereby, occurrence of the disturbance can be prevented.

In the example of FIG. 19, the concentrations of impurities such as boron in the plurality of p-type semiconductor regions s2 arranged in the X direction are all different. However, such a configuration is merely an example. For example, the plurality of selected transistors STr adjacent in the X direction may be grouped into a plurality of groups, and the plurality of selected transistors STr in the same group may have the same configuration.

In the example of FIG. 19, all the gate insulating films GI are independent for each selected transistor STr. However, the plurality of gate insulating films GI arranged in the X direction may be connected to each other.

[Transistor Array TA_E]

Figure 20:
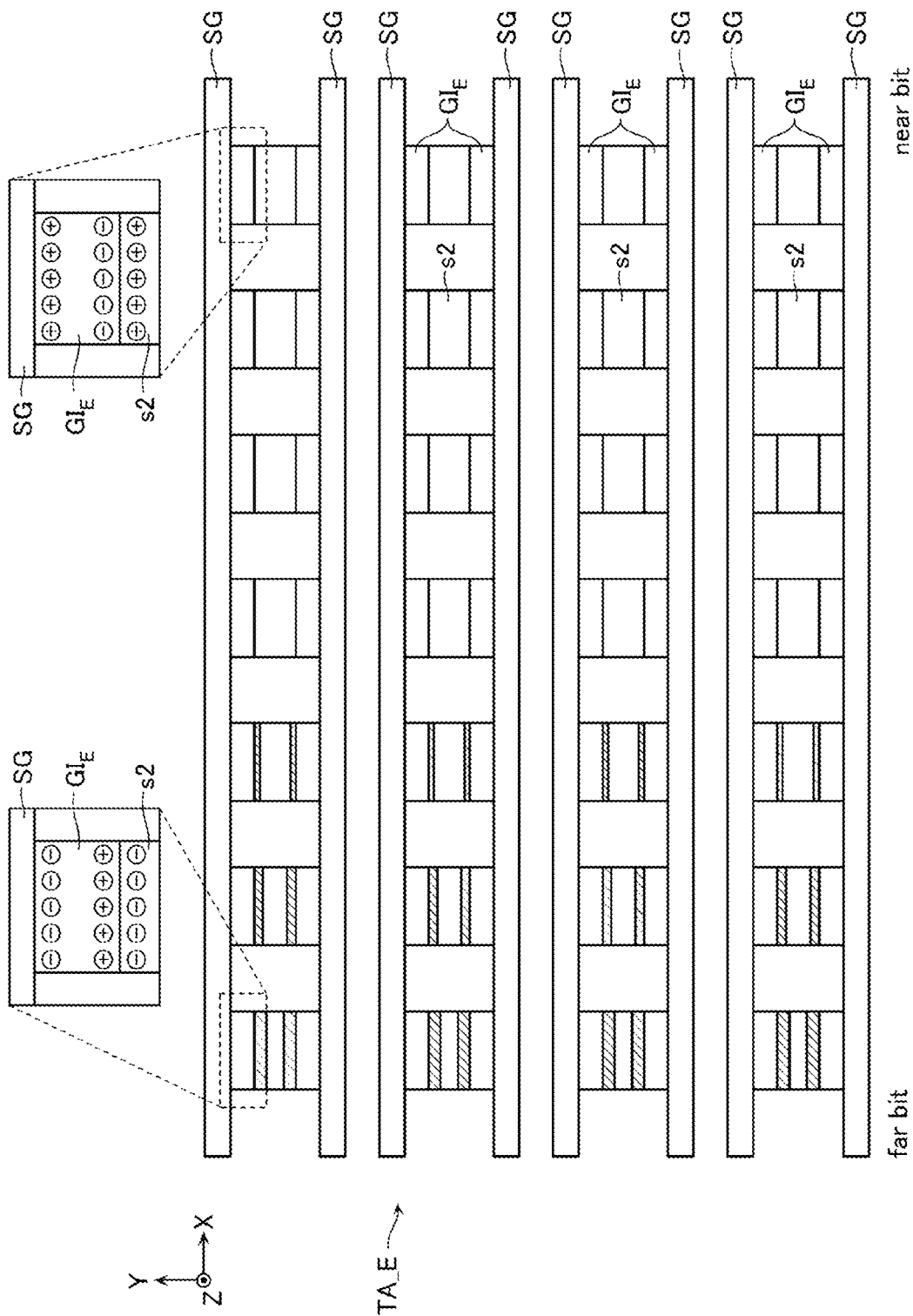

FIG. 20 is a schematic XY cross-sectional view showing a configuration of a transistor array TA_E according to a fifth configuration example. The transistor array TA_E is basically configured as described with reference to FIG. 3. However, in the transistor array TA_E, a gate insulating film $GI_E$ functions as a ferroelectric film. For example, the gate insulating film $GI_E$ may contain tetragonal hafnium oxide as described above. For example, when a positive polarization is such that negative electron charge is induced on the surface of the gate insulating film $GI_E$ on the selected gate line SG side and positive electron charge is induced on the surface of the semiconductor portion S side, and a negative polarization is such that positive electron charge is induced on the surface of the gate insulating film $GI_E$ on the selected gate line SG side and negative charge is induced on the surface of the semiconductor portion S side, the gate insulating film $GI_E$ provided at the near bit side is more strongly polarized in the negative direction, and the gate insulating film $GI_E$ at the far bit side is more strongly polarized in the positive direction. Therefore, positive electron charge is induced on the surface of the p-type semiconductor region s2 of the semiconductor portion S provided at the near bit side, and negative electron charge is induced on the surface of the p-type semiconductor region s2 of the semiconductor portion S provided at the far bit side.

According to such a configuration, the selected transistor STr provided at the near bit side has a weaker electric field applied to the p-type semiconductor region s2, and the selected transistor STr provided at the far bit side has a stronger electric field applied to the p-type semiconductor region s2. Accordingly, the selected transistor STr provided at the near bit side increases the voltage division when the voltage Vreset or the like is supplied. Thereby, occurrence of the disturbance can be prevented.

According to such a configuration, after manufacturing the semiconductor storage device, the threshold voltage of the selected transistor Str can be adjusted after confirming the magnitude of the voltage drop in the word line WL, and the occurrence of the disturbance can be prevented with high accuracy.

When the state of polarization does not change for a certain period of time, the ferroelectric may exhibit a so-called imprint phenomenon in which the polarization state is difficult to change. By such a phenomenon, the polarization state in the gate insulating film $GI_E$ can be suitably maintained.

When such a configuration is adopted, for example, the material of the gate insulating film $GI_E$ and the material of the variable resistance film VR may be the same material. For example, when using hafnium oxide ($HfO_x$) as a material of the gate insulating film $GI_E$ and the variable resistance film VR, in the variable resistance film VR, a filament such as an oxygen defect may be formed in the hafnium oxide layer, or the hafnium oxide layer may be a tunnel insulating film functioning as a ferroelectric film. In such a case, for example, the gate insulating film $GI_E$ and the variable resistance film VR may be formed in a common process.

In the example of FIG. 20, the gate insulating film $GI_E$ of the selected transistor STr at the far-bit side is polarized in the positive direction, whereby an electron channel is formed on the surface of the p-type semiconductor region s2 of the semiconductor portion S. However, when such a configuration is adopted, in order to turn off the selected transistor STr at the far bit side, it is necessary to supply a negative voltage to the selected gate line SG. Therefore, in order to reduce power consumption, it is also possible to adjust the polarizability and the like of the gate insulating film $GI_E$ so that the selected transistor STr at the far bit side is turned off even in a state where no negative voltage is supplied to the selected gate line SG.

The direction of polarization and the polarizability of each selected transistor STr may be adjusted as appropriate. For example, a plurality of gate insulating films $GI_E$ arranged in the X direction may all have different polarizabilities. For example, the plurality of selected transistors STr adjacent in the X direction may be grouped into a plurality of groups, and the polarization directions and polarizabilities of the plurality of gate insulating films $GI_E$ in the same group may be the same.

Figure 21:
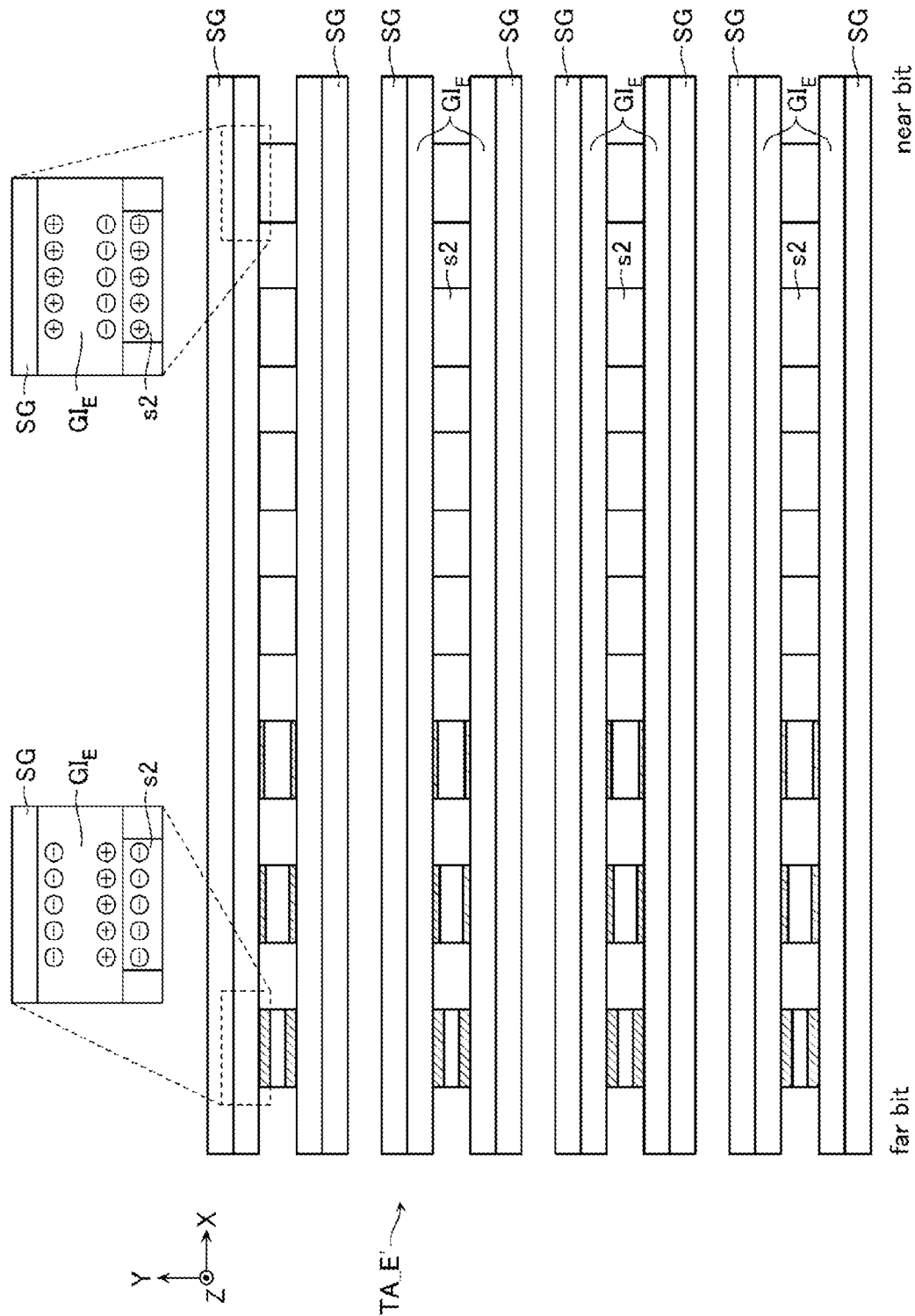

In the example of FIG. 20, all the gate insulating films $GI_E$ are independent for each selected transistor STr. However, for example, as shown in FIG. 21, the plurality of gate insulating films $GI_E$ arranged in the X direction may be connected to each other.

[Transistor Array TA_F]

Figure 22:
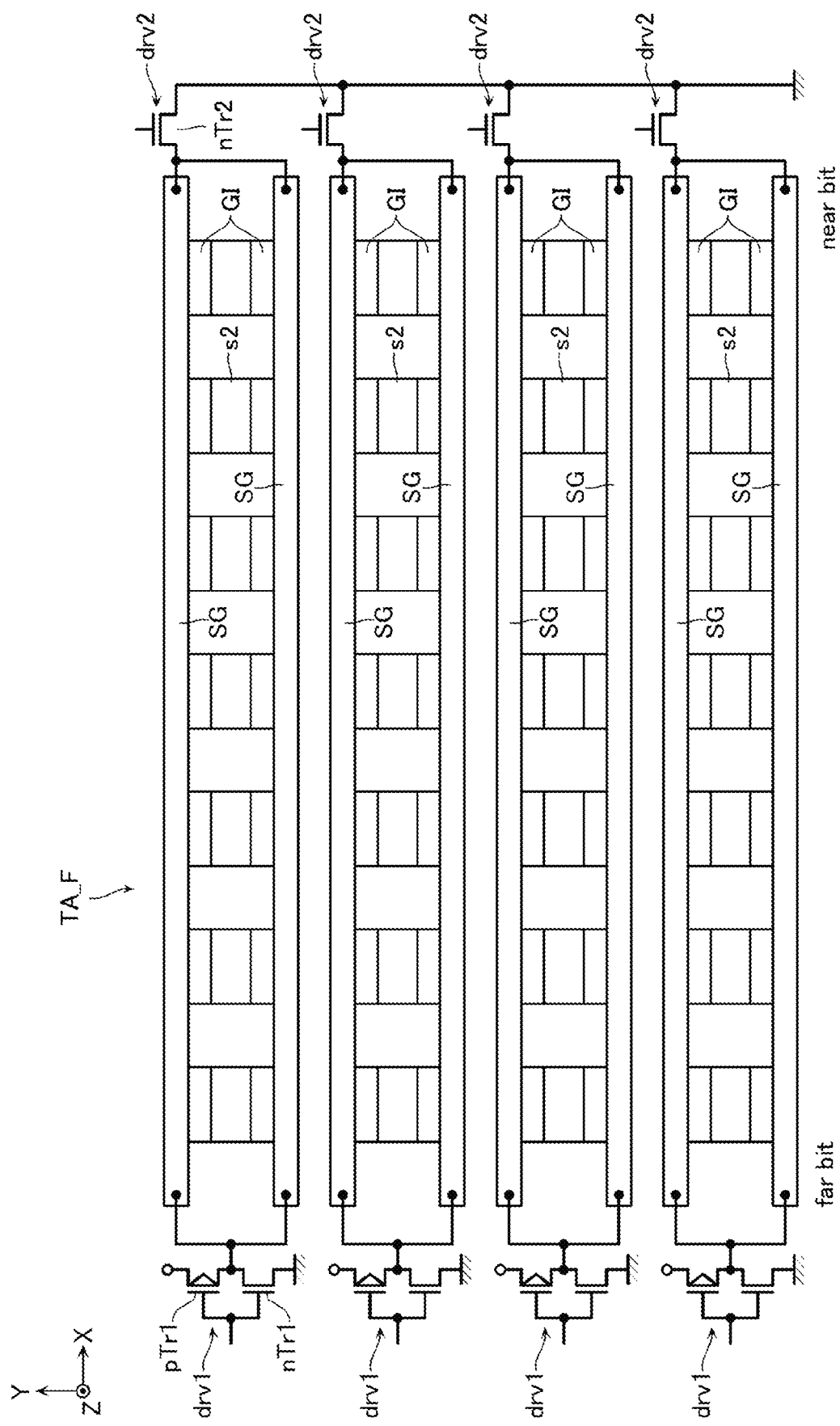

FIG. 22 is a schematic XY cross-sectional view showing a configuration of a transistor array TA_F according to a sixth configuration example. The transistor array TA_F is basically configured as described with reference to FIG. 3. However, in the sixth configuration example, the selected gate line decoding circuit includes AND circuits and voltage transfer circuits drv1 and drv2. Among the two end portions of the selected gate line SG in the X direction, the end portion at the far-bit side is connected to the voltage transfer circuit drv1, and the end portion at the near bit side is connected to the voltage transfer circuit drv2.

The voltage transfer circuit drv1 includes a voltage transfer transistor pTr1 that makes the selected gate line SG conductive with the ON voltage supply line when "L" is input to the gate electrode, and a voltage transfer transistor nTr1 that makes the selected gate line SG conductive with the OFF voltage supply line when "H" is input to the gate electrode. The voltage transfer circuit drv2 includes a voltage transfer transistor nTr2 that makes the selected gate line SG conductive with a ground voltage supply line when "H" is input to the gate electrode.

According to such a configuration, by passing a current through the selected gate line SG, a voltage drop due to the wiring resistance of the selected gate line SG occurs, and a voltage gradient occurs in the selected gate line SG. Accordingly, the selected transistor STr provided at the near bit side has a weaker electric field applied to the p-type semiconductor region s2, and the selected transistor STr provided at the far bit side has a stronger electric field applied to the p-type semiconductor region s2. Accordingly, the selected transistor STr provided at the near bit side increases the voltage division when the voltage Vreset or the like is supplied. Thereby, occurrence of the disturbance can be prevented.

In the example of FIG. 20, all the gate insulating films GI are independent for each selected transistor STr. However, the plurality of gate insulating films GI arranged in the X direction may be connected to each other.

Second Embodiment

[Memory Cell Array MCA']

Figure 23:
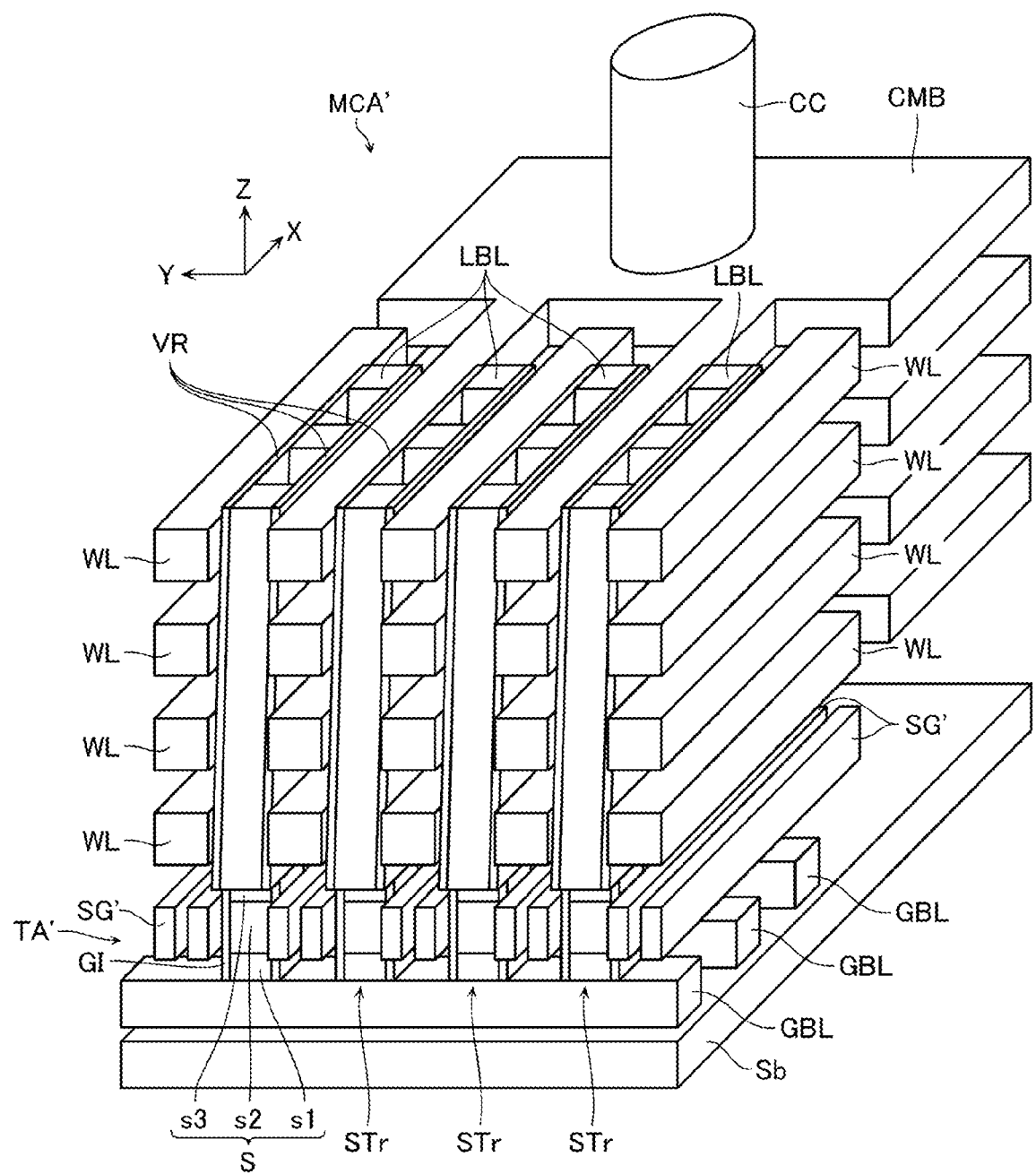
FIG. 23 is a schematic perspective view showing a partial configuration of a semiconductor storage device according to a second embodiment.
Figure 24:
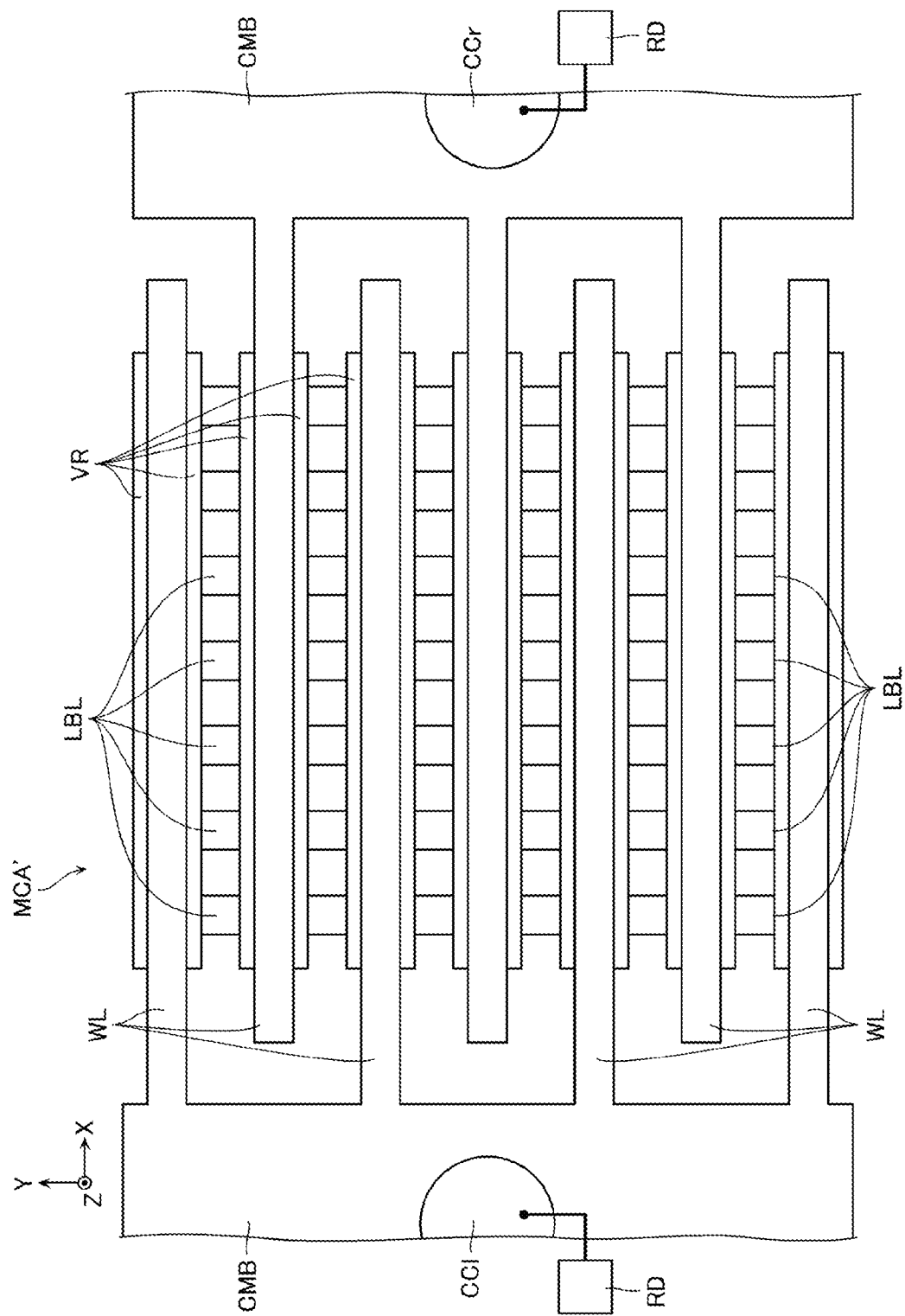
FIGS. 24 and 25 are schematic plan views each showing a partial configuration of the semiconductor storage device.
Figure 25:
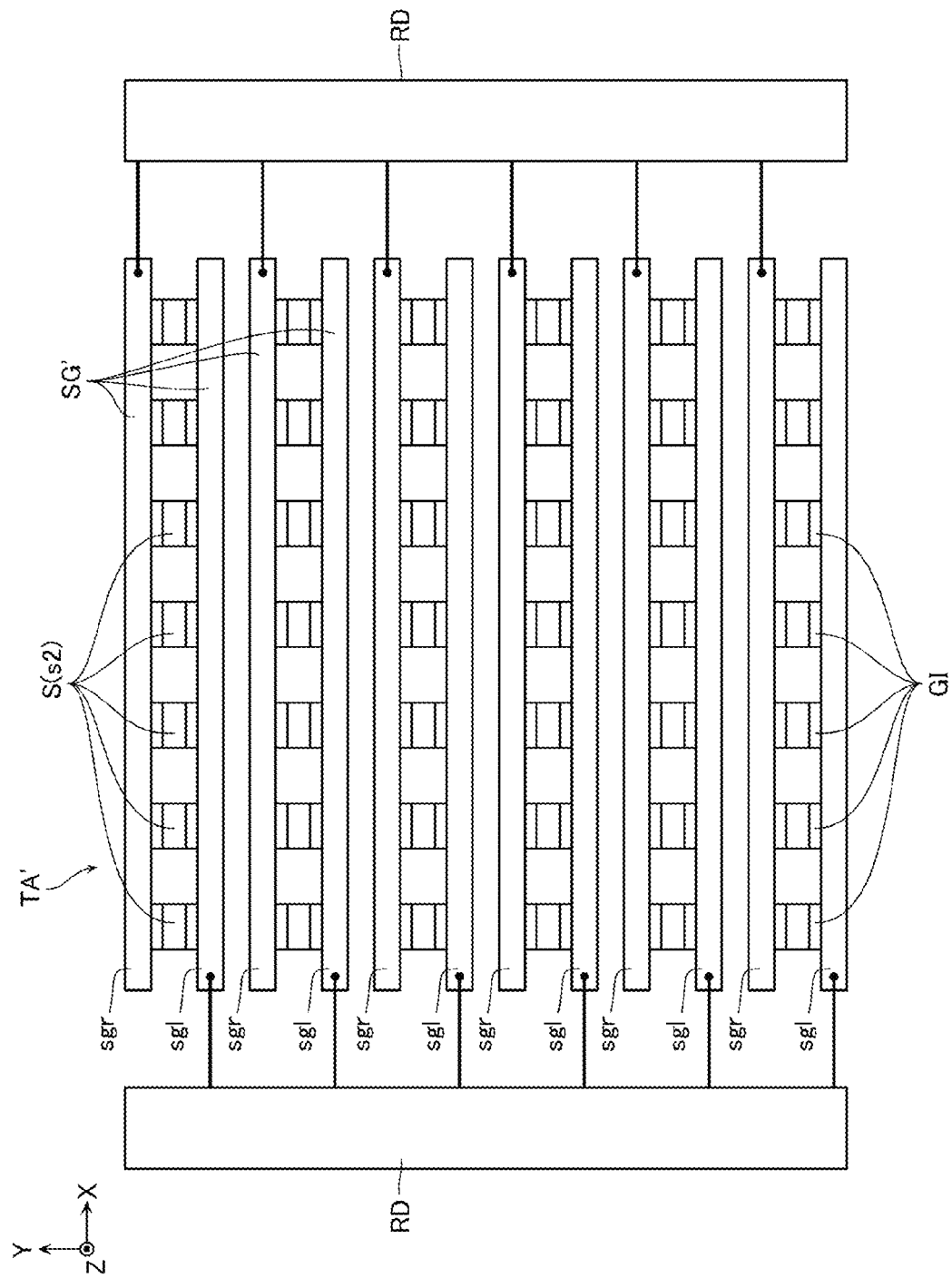

FIG. 23 is a schematic perspective view showing a configuration of a memory cell array MCA' and a transistor array TA' according to a second embodiment. FIG. 24 is a schematic XY cross-sectional view showing a partial configuration of the memory cell array MCA'. FIG. 25 is a schematic XY cross-sectional view showing a partial configuration of the transistor array TA'.

As shown in FIG. 23, the memory cell array MCA' according to the present embodiment is basically configured in the same manner as the memory cell array MCA according to the first embodiment. However, the memory cell array MCA' according to the present embodiment includes a wiring CMB connected to the plurality of word lines WL arranged in the Y direction. A contact CC extending in the Z direction is connected to the wiring CMB. In the present embodiment, the word line WL is connected to the row decoder RD via the wiring CMB and the contact CC.

As shown in FIG. 24, the wiring CMB and the contact CC (i.e., CCr and CCl) are provided in the region on both end sides in the X direction of the region in which the word line WL, the local bit line LBL, and the variable resistance film VR are provided. In the example of FIG. 24, the even-numbered word lines WL counted from one end side in the Y direction are connected to the wiring CMB provided on one end side in the X direction (i.e., the right side in FIG. 24), and this wiring CMB is connected to the contact CCr. The odd-numbered word lines WL are connected to the wiring CMB provided on the other end side in the X direction (i.e., the left side in FIG. 24), and this wiring CMB is connected to the contact CCl.

According to such a configuration, compared with the memory cell array MCA according to the first embodiment, the number of wirings and contacts for connecting the word line WL and the row decoder RD can be greatly reduced. For example, in the example of FIG. 24, when focusing on the configuration corresponding to the even-numbered word lines WL counted from one side in the Y direction, one end side in the X direction (i.e., the right side in FIG. 24) is the near bit side, and the other end side in X direction (i.e., the left side in FIG. 24) is the far bit side. On the other hand, when focusing on the configuration corresponding to the odd-numbered word lines WL, the other end side in the X direction (i.e., the left side in FIG. 24) is the near bit side, and one end side in the X direction (i.e., the right side in FIG. 24) is the far bit side.

[Transistor Array TA']

Even when the even-numbered word lines WL are selected, and even when the odd-numbered word lines WL are selected, the transistor array TA' according to the present embodiment is configured such that the selected transistor STr located at the near bit side has a larger voltage division in the reset operation and the selected transistor STr located at the far bit side has a smaller voltage division in the reset operation and the like. Hereinafter, this point will be described.

As shown in FIG. 23, the transistor arrays TA' according to the present embodiment are basically configured in the same manner as the transistor array TA according to the first embodiment. However, for example, as shown in FIG. 25, a selected gate line SG' according to the present embodiment includes a pair of electrode portions sgl and sgr extending in the X direction and facing the p-type semiconductor region s2 of the semiconductor portion S from the Y direction.

In the present embodiment, for example, when the memory cell MC connected to the contact CCr is selected during the read operation, the set operation, and the reset operation, an ON voltage is supplied to one of a plurality of electrode portions sgr, and an OFF voltage is supplied to the other electrode portions sgr and sgl. On the other hand, when the memory cell MC connected to the contact CCl is selected, an ON voltage is supplied to one of a plurality of electrode portions sgl, and an OFF voltage is supplied to the other electrode portions sgr and sgl. For example, in the plurality of AND circuits of the selected gate line decoding circuit according to the present embodiment, among the plurality of electrode portions sgr and sgl, the AND circuit corresponding to one of the electrode portions sgr and sgl specified by the row address RA outputs "L", and the other AND circuits output "H".

The configuration of the transistor array TA' shown in FIGS. 23 and 25 is a schematic view for description. A configuration example of the transistor array TA' according to the present embodiment will be described later with reference to FIGS. 26 to 29.

[Transistor Array TA_A"]

Figure 26:
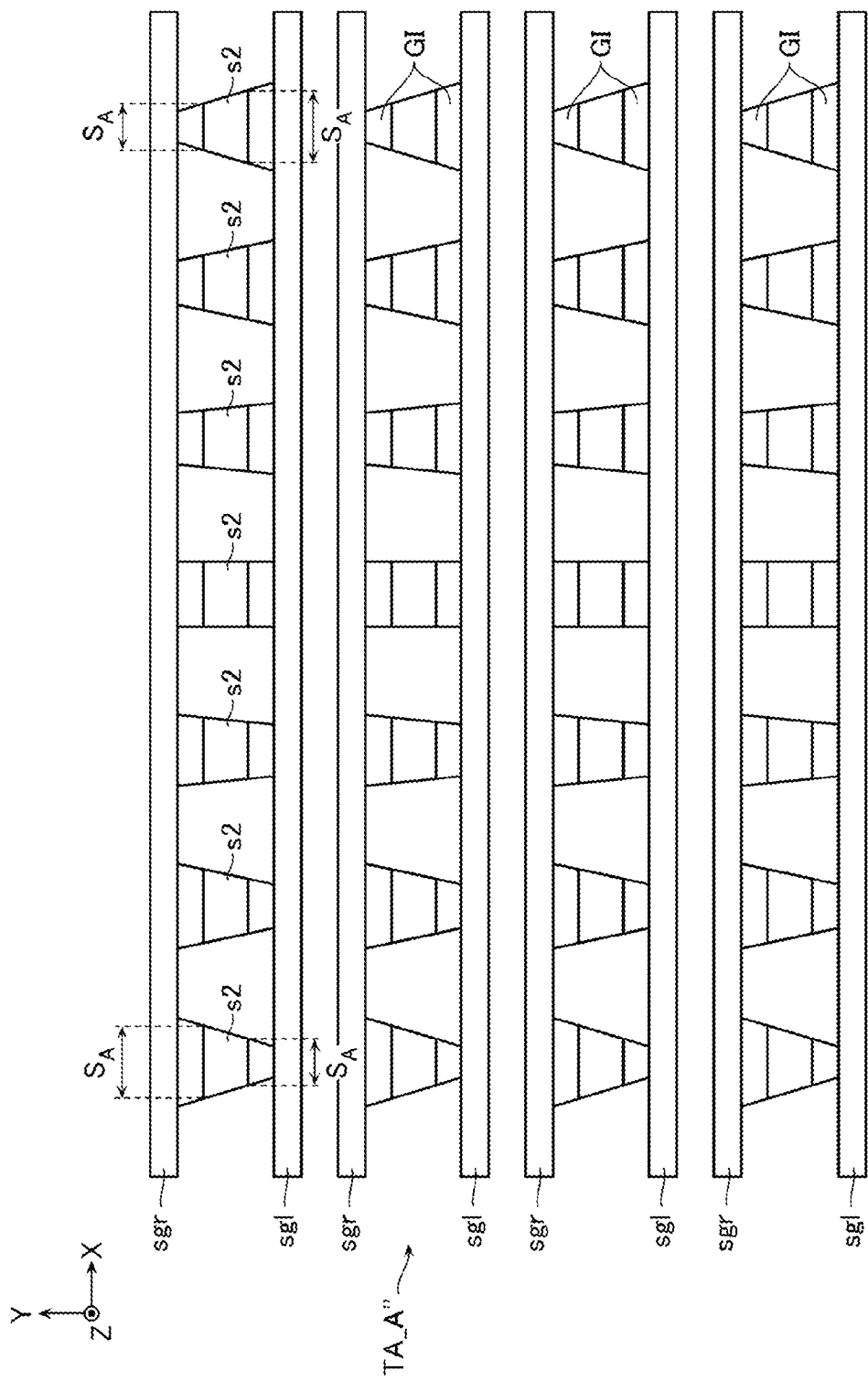
FIGS. 26-29 are schematic plan views each showing a configuration example of a transistor array TA' of the semiconductor storage device.

FIG. 26 is a schematic XY cross-sectional view showing a configuration of a transistor array TA_A" according to a first configuration example. The transistor array TA_A" is basically configured as described with reference to FIG. 23. However, in the transistor array TA_A", the plurality of p-type semiconductor regions s2 arranged in the X direction are formed in a trapezoidal shape in the XY cross section of FIG. 26. The p-type semiconductor region s2 provided on one end side in the X direction (i.e., the right side in FIG. 26) has a smaller facing area SA of the electrode portion sgr and a larger facing area $S_A$ of the electrode portion sgl. The p-type semiconductor region s2 provided on the other end side in the X direction (i.e., the left side in FIG. 26) has a larger facing area $S_A$ of the electrode portion sgr and a smaller facing area $S_A$ of the electrode portion sgl.

In the example of FIG. 26, the facing areas of the plurality of p-type semiconductor regions s2 arranged in the X direction that face the electrode portions sgr and sgl are all different. However, such a configuration is merely an example. For example, the plurality of selected transistors STr adjacent in the X direction may be grouped into a plurality of groups, and the plurality of selected transistors STr in the same group may have the same configuration.

In the example of FIG. 26, all the gate insulating films GI are independent for each selected transistor STr. However, the plurality of gate insulating films GI arranged in the X direction may be connected to each other.

[Transistor Array TA_B"]

Figure 27:
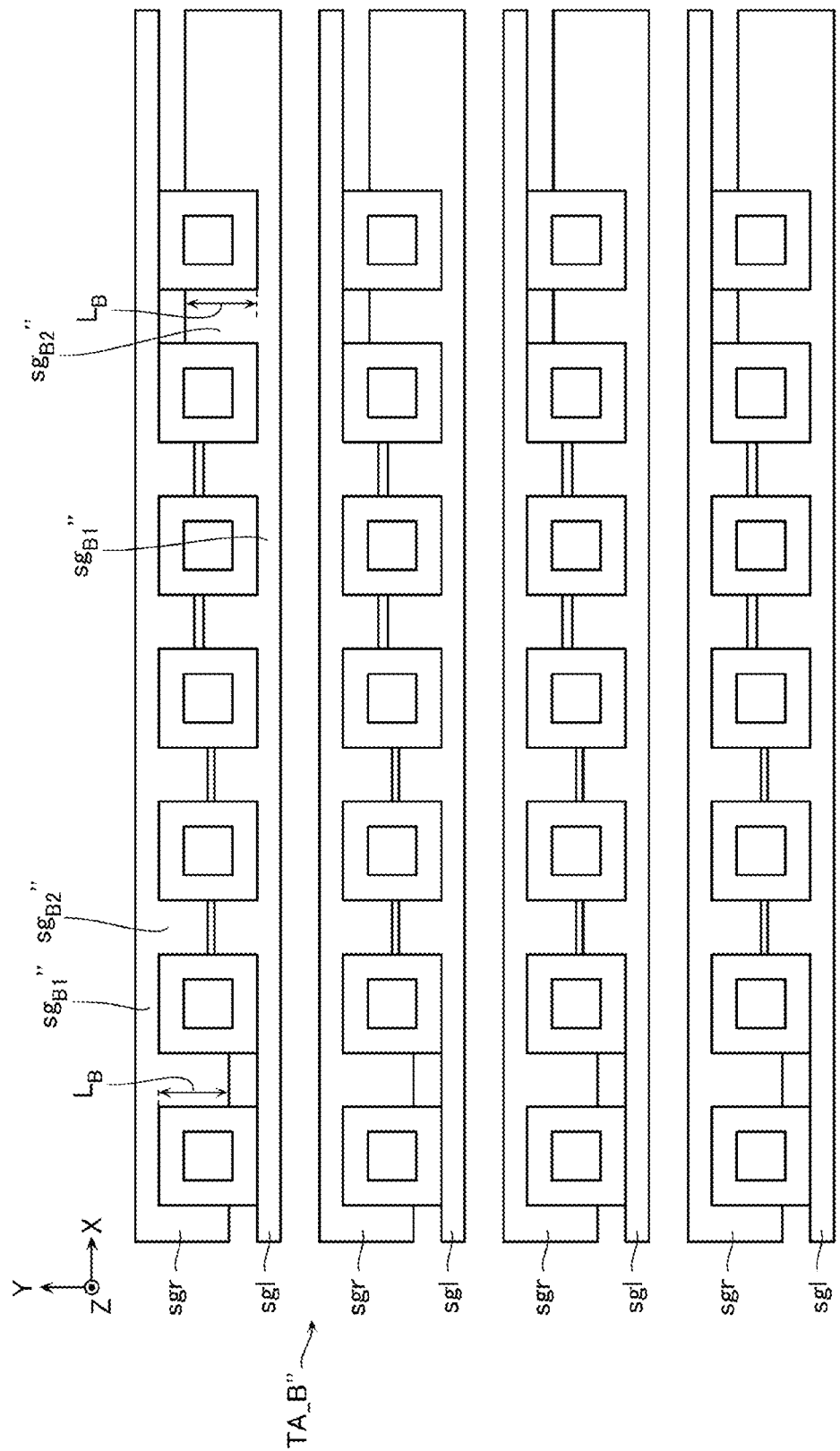

FIG. 27 is a schematic XY cross-sectional view showing a configuration of a transistor array TA_B" according to a second configuration example. The transistor array TA_B" is basically configured as described with reference to FIG. 23. However, in the transistor array TA_B", the p-type semiconductor region s2 provided on one end side in the X direction (i.e., the right side in FIG. 26) has a smaller facing area $S_A$ of the electrode portion sgr and a larger facing area $S_A$ of the electrode portion sgl. The p-type semiconductor region s2 provided on the other end side in the X direction (i.e., the left side in FIG. 26) has a larger facing area $S_A$ of the electrode portion sgr and a smaller facing area $S_A$ of the electrode portion sgl.

That is, in the transistor array TA_B", the electrode portions sgr and sgl each include an Y gate electrode portion $sg_{B1}"$ extending in the X direction and facing the p-type semiconductor region s2 of the semiconductor portion S from the Y direction, and a plurality of X gate electrode portions $sg_{B2}"$ connected to the Y gate electrode portion $sg_{B1}"$ and facing the p-type semiconductor region s2 of the semiconductor portion S from the X direction. Among the plurality of X gate electrode portions $sg_{B2}"$ connected to the Y gate electrode portion $sg_{B1}"$ of the electrode portion sgr, the X gate electrode portion $sg_{B2}"$ provided at one end side in the X direction (i.e., the right side in FIG. 26) has a smaller length $L_B$ in the Y direction, and the X gate electrode portion $sg_{B2}$ provided at the other end side in the X direction (i.e., the left side in FIG. 26) has the larger length $L_B$ in the Y direction. Among the plurality of X gate electrode portions $sg_{B2}"$ connected to the Y gate electrode portion $sg_{B1}"$ of the electrode portion sgl, the X gate electrode portion $sg_{B2}"$ provided at one end side in the X direction (i.e., the right side in FIG. 26) has a larger length $L_B$ in the Y direction, and the X gate electrode portion $sg_{B2}$ provided at the other end side in the X direction (i.e., the left side in FIG. 26) has a smaller length $L_B$ in the Y direction.

In the example of FIG. 27, the facing areas of the plurality of p-type semiconductor regions s2 arranged in the X direction that face the electrode portions sgr and sgl are all different. However, such a configuration is merely an example. For example, the plurality of selected transistors STr adjacent in the X direction may be grouped into a plurality of groups, and the plurality of selected transistors STr in the same group may have the same configuration.

[Transistor Array TA_E"]

Figure 28:
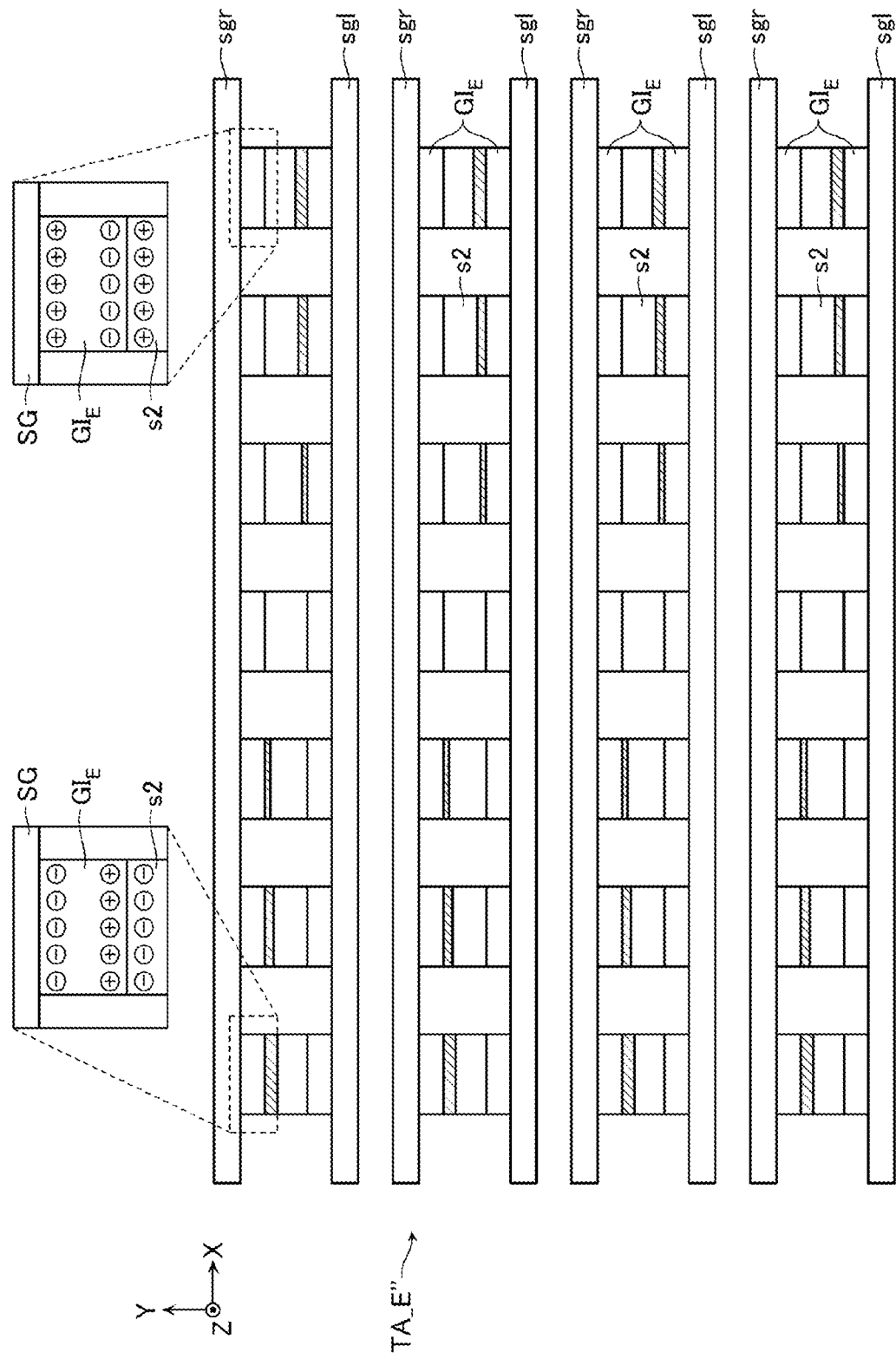

FIG. 28 is a schematic XY cross-sectional view showing a configuration of a transistor array TA_E" according to a third configuration example. The transistor array TA_E" is basically configured as described with reference to FIG. 23. However, in the transistor array TA_E", the gate insulating film $GI_E$ functions as a ferroelectric film. For example, the gate insulating film $GI_E$ may contain tetragonal hafnium oxide as described above. Among the plurality of gate insulating films $GI_E$ provided between the electrode portion sgr and the p-type semiconductor region s2, the gate insulating film $GI_E$ provided on one end side in the X direction (i.e., the right side in FIG. 28) is more strongly polarized in the negative direction, and the gate insulating film $GI_E$ provided on the other end side in the X direction (i.e., the left side in FIG. 26) is strongly polarized in the positive direction. Among the plurality of gate insulating films $GI_E$ provided between the electrode portion sgl and the p-type semiconductor region s2, the gate insulating film $GI_E$ provided on one end side in the X direction (i.e., the right side in FIG. 28) is more strongly polarized in the positive direction, and the gate insulating film $GI_E$ provided on the other end side in the X direction (i.e., the left side in FIG. 26) is more strongly polarized in the negative direction.

In the example of FIG. 28, a part of the gate insulating film $GI_E$ is polarized in the positive direction, whereby an electron channel is formed on the surface of the p-type semiconductor region s2 of the semiconductor portion S. However, it is also possible to adjust the polarizability and the like of the gate insulating film $GI_E$ so that the selected transistor STr at the far bit side is turned off even in a state where no negative voltage is supplied to the selected gate line SG.

The direction of polarization and the polarizability of each selected transistor STr may be adjusted as appropriate. For example, a plurality of gate insulating films $GI_E$ arranged in the X direction may all have different polarizabilities. For example, the plurality of selected transistors STr adjacent in the X direction may be grouped into a plurality of groups, and the polarization directions and polarizabilities of the plurality of gate insulating films $GI_E$ in the same group may be the same.

In the example of FIG. 28, all the gate insulating films $GI_E$ are independent for each selected transistor STr. However, for example, the plurality of gate insulating films $GI_E$ arranged in the X direction may be connected to each other.

[Transistor Array TA_F"]

Figure 29:
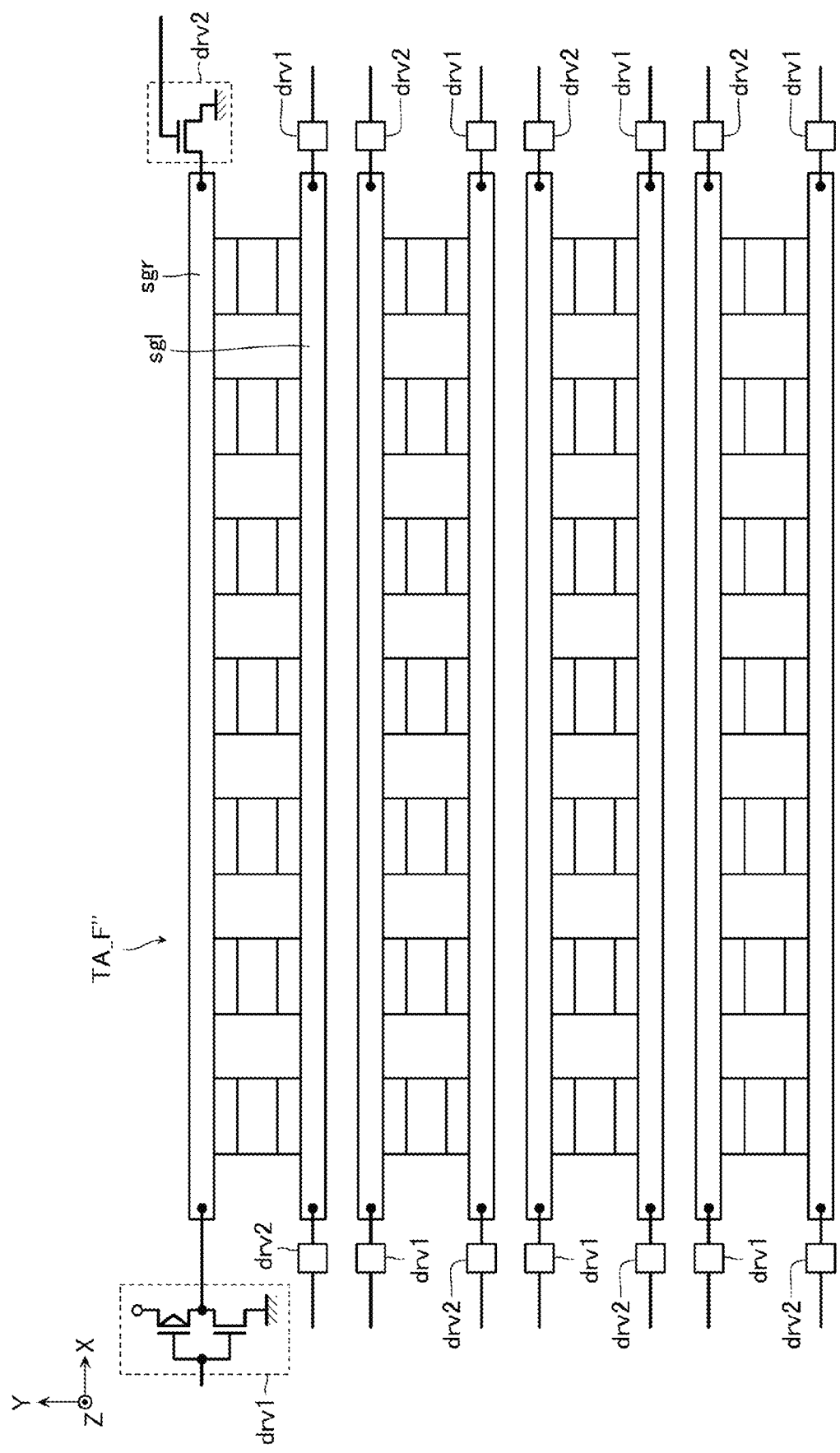

FIG. 29 is a schematic XY cross-sectional view showing a configuration of a transistor array TA_F" according to a fourth configuration example. The transistor array TA_E" is basically configured as described with reference to FIG. 23. However, in the fourth configuration example, the selected gate line decoding circuit includes the voltage transfer circuits drv1 and drv2. The end portion of one end side of the electrode portion sgr in the X direction (i.e., the right side in FIG. 28) is connected to the voltage transfer circuit drv2, and the end portion of the other end in the X direction (i.e., the left side in FIG. 26) is connected to the voltage transfer circuit drv1. The end portion of one end side of the electrode portion sgl in the X direction (i.e., the right side in FIG. 28) is connected to the voltage transfer circuit drv1, and the end portion of the other end in the X direction (i.e., the left side in FIG. 26) is connected to the voltage transfer circuit drv2.

In the example of FIG. 29, all the gate insulating films GI are independent for each selected transistor STr. However, the plurality of gate insulating films GI arranged in the X direction may be connected to each other.

Third Embodiment

Figure 30:
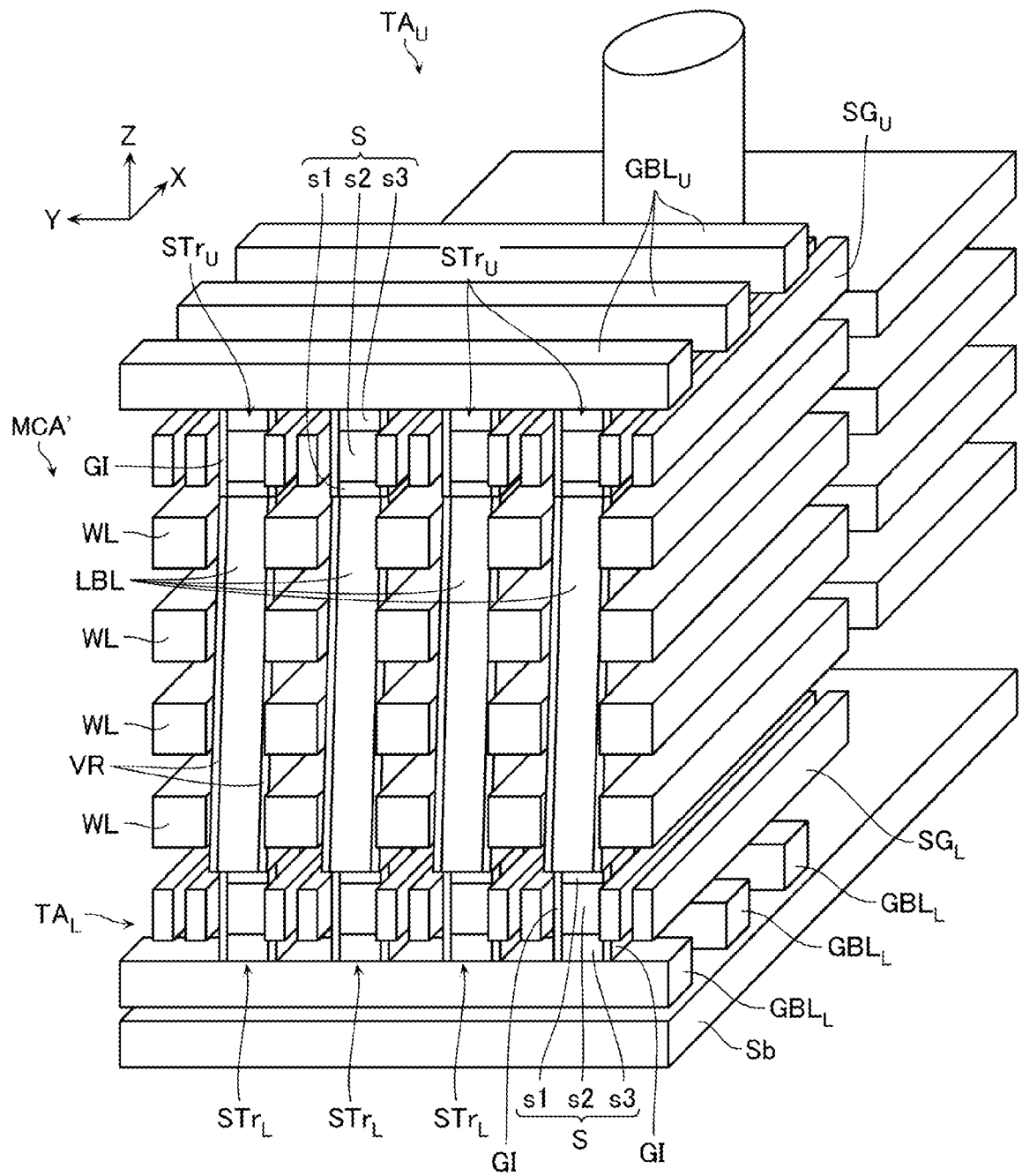
FIG. 30 is a schematic perspective view showing a partial configuration of a semiconductor storage device according to a third embodiment.

FIG. 30 is a schematic perspective view showing a configuration of the memory cell array MCA' and transistor arrays $TA_L$ and $TA_U$ according to a third embodiment.

As shown in FIG. 30, the semiconductor storage device according to the present embodiment includes the memory cell array MCA', the transistor array $TA_L$ provided below the memory cell array MCA', and the transistor array $TA_U$ provided above the memory cell array MCA'.

The transistor array $TA_L$ includes a plurality of global bit lines $GBL_L$ arranged in the X direction and extending in the Y direction, a plurality of selected transistors $STr_L$ arranged in the X direction and the Y direction, and a plurality of selected gate lines $SG_L$ arranged in the Y direction and extending in the X direction. These configurations are the same as the plurality of global bit lines GBL, the plurality of selected transistors STr, and the plurality of selected gate lines SG according to the first embodiment.

The transistor array $TA_U$ includes a plurality of global bit lines $GBL_U$ arranged in the X direction and extending in the Y direction, a plurality of selected transistors $STr_U$ arranged in the X direction and the Y direction, and a plurality of selected gate lines $SG_U$ arranged in the Y direction and extending in the X direction. These configurations are the same as the plurality of global bit lines GBL, the plurality of selected transistors STr, and the plurality of selected gate lines SG according to the first embodiment. However, the transistor array $TA_U$ has a configuration in which the transistor array $TA_L$ is turned upside down.

Similar to the second embodiment, even when the even-numbered word lines WL in FIG. 24 are selected, or even when the odd-numbered word lines WL are selected, the transistor arrays $TA_L$ and $TA_U$ according to the present embodiment are configured such that the selected transistor STr located at the near bit side has a larger voltage division in the reset operation and the selected transistor STr located at the far bit side has a smaller voltage division in the reset operation and the like. Hereinafter, this point will be described.

The transistor arrays $TA_L$ and $TA_U$ according to the present embodiment are basically configured in the same manner as the transistor array TA according to the first embodiment. However, in the present embodiment, for example, when the memory cell MC connected to the contact CCr is selected during the read operation, the set operation, and the reset operation, an ON voltage is supplied to one of the plurality of selected gate lines $SG_L$, and an OFF voltage is supplied to the other selected gate lines $SG_L$ and $SG_U$. On the other hand, when the memory cell MC connected to the contact CCl is selected, an ON voltage is supplied to one of the plurality of selected gate lines $SG_U$, and an OFF voltage is supplied to the other selected gate lines $SG_L$ and $SG_U$. For example, in the plurality of AND circuits of the selected gate line decoding circuit according to the present embodiment, among the plurality of selected gate lines $SG_L$ and $SG_U$, the AND circuit corresponding to one of the selected gate lines $SG_L$ and $SG_U$ specified by the row address RA outputs "L", and the other AND circuits output "H".

The transistor arrays $TA_L$ and $TA_U$ basically have the same configuration as the transistor array TA according to the first embodiment. However, in the transistor array $TA_L$, the selected transistor STr provided at one end in the X direction has a larger voltage division when the voltage Vreset or the like is supplied, and the selected transistor STr provided on the other end side in the X direction has a smaller voltage division when the voltage Vreset or the like is supplied. On the other hand, in the transistor array $TA_U$, the selected transistor STr provided at one end in the X direction has a smaller voltage division when the voltage Vreset or the like is supplied, and the selected transistor STr provided on the other end side in the X direction has a larger voltage division when the voltage Vreset or the like is supplied. Although the specific configuration of the transistor arrays $TA_L$ and $TA_U$ can be adjusted as appropriate, for example, any of the configurations described with reference to FIGS. 14 to 22 may be provided.

Figure 31:
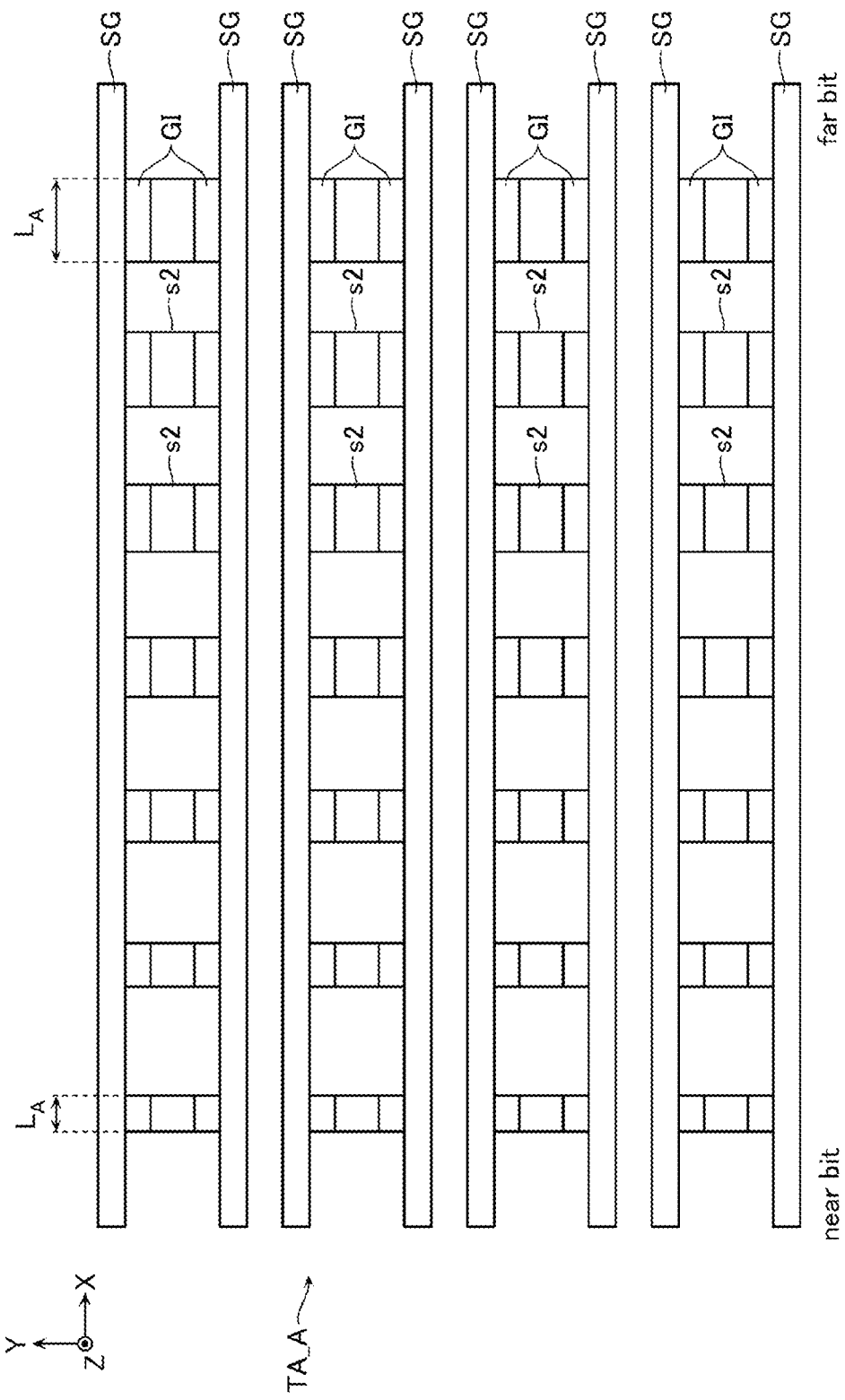
FIG. 31 is a schematic plan view showing a configuration of a transistor array TAU of the semiconductor storage device.

For example, when the structure of the transistor array TA_A as described with reference to FIG. 14 is adopted as the configuration of the transistor array $TA_L$, it is conceivable to adopt, as the configuration of the transistor array $TA_U$, a structure that is line-symmetric with the transistor array TA_A as shown in FIG. 31. Even if the structure of the transistor array TA_A is adopted as the structure of the transistor array $TA_L$, any of the configurations described with reference to FIGS. 15 to 22 may be adopted as the configuration of the transistor array $TA_U$.

Other Embodiments

The semiconductor storage device according to the first to third embodiments has been described above. However, the above configuration are merely examples, and any other configurations may be adopted as appropriate. For example, some of the above-described configurations may be used in combination.

In the above description, in order to mitigate the influence of the voltage drop in the word line WL, a difference in configuration or the like is provided between the plurality of selected transistors STr arranged in the X direction. However, for example, in order to mitigate the influence of the voltage drop in the global bit line GBL, a difference in configuration or the like may be provided between the plurality of selected transistors STr arranged in the Y direction. In order to reduce the influence of the voltage drop in the peripheral circuit or the like, a difference in configuration or the like may be provided between the plurality of selected transistors STr arranged in the X direction or the Y direction.

[Others]

Although several embodiments of the present disclosure have been described, these embodiments have been presented by way of example and are not intended to limit the scope of the disclosure. These novel embodiments may be implemented in various other forms, and various omissions, replacements, and changes may be made without departing from the spirit of the disclosure. These embodiments and modification examples thereof are included in the scope and gist of the disclosure and are included in the disclosure described in the claims and the equivalent scope thereof.

What is claimed is:
1. A semiconductor storage device comprising:
   a substrate;
   a plurality of first wirings arranged above the substrate in a first direction intersecting a surface of the substrate and extending in a second direction intersecting the first direction;
   a plurality of second wirings arranged above the substrate in the second direction and extending in the first direction;
   a plurality of first variable resistance portions arranged between the plurality of first wirings and the plurality of second wirings;
   a plurality of third wirings provided between the plurality of second wirings and the substrate, arranged in the second direction, and extending in a third direction intersecting the first and second directions;
   a plurality of semiconductor portions each electrically connected to one end of one of the plurality of second wirings in the first direction and one of the plurality of third wirings;

a fourth wiring extending in the second direction and facing the plurality of semiconductor portions in the third direction;

a plurality of first insulating portions each provided between one of the plurality of semiconductor portions and the fourth wiring; and a first contact electrically connected to an end of each of the plurality of first wirings in the second direction, wherein the plurality of semiconductor portions include a first semiconductor portion and a second semiconductor portion closer to the first contact than the first semiconductor portion, and a length in the second direction of one of the first insulating portions between the first semiconductor portion and the fourth wiring is greater than a length in the second direction of another one of the first insulating portions between the second semiconductor portion and the fourth wiring.

2. The semiconductor storage device according to claim 1, wherein an area of a surface of the first semiconductor portion that faces said one of the first insulating portions is larger than an area of a surface of the second semiconductor portion that faces said another one of the first insulating portions.

3. The semiconductor storage device according to claim 1, further comprising:

a plurality of fifth wirings arranged in the first direction and extending in the second direction;

a plurality of second variable resistance portions between the plurality of fifth wirings and the plurality of second wirings; and a second contact electrically connected to an end of each of the plurality of fifth wirings in the second direction and arranged opposite to the first contact.

4. The semiconductor storage device according to claim 3, further comprising:

a sixth wiring extending in the second direction and facing the plurality of semiconductor portions in the third direction;

a plurality of second insulating portions each provided between one of the plurality of semiconductor portions and the sixth wiring; and a voltage supply circuit capable of supplying different voltages to the fourth and sixth wirings.

5. The semiconductor storage device according to claim 3, further comprising:

a plurality of seventh wirings arranged in the second direction above the plurality of second wirings and extending in the third direction, a plurality of other semiconductor portions each electrically connected to the other end of one of the plurality of second wirings in the first direction and one of the plurality of seventh wirings;

an eighth wiring extending in the second direction and facing said other semiconductor portions in the third direction; and a plurality of third insulating portions each provided between one of said other semiconductor portions and the eighth wiring.

6. The semiconductor storage device according to claim 1, wherein the plurality of first insulating portions are connected to each other.

7. The semiconductor storage device according to claim 1, wherein the plurality of semiconductor portions comprise first and second groups of semiconductor portions arranged in the second direction, the second group of semiconductor portions are closer to the first contact than the first group of semiconductor portions, and a length in the second direction of one of the first insulating portions between each of the first group of semiconductor portions and the fourth wiring is greater than a length in the second direction of another one of the first insulating portions between each of the second group of semiconductor portions and the fourth wiring.

8. A semiconductor storage device comprising:

a substrate;

a plurality of first wirings arranged above the substrate in a first direction intersecting a surface of the substrate and extending in a second direction intersecting the first direction;

a plurality of second wirings arranged above the substrate in the second direction and extending in the first direction;

a plurality of first variable resistance portions arranged between the plurality of first wirings and the plurality of second wirings;

a plurality of third wirings provided between the plurality of second wirings and the substrate, arranged in the second direction, and extending in a third direction intersecting the first and second directions;

a plurality of semiconductor portions each electrically connected to one end of one of the plurality of second wirings in the first direction and one of the plurality of third wirings;

a fourth wiring extending in the second direction and facing the plurality of semiconductor portions in the third direction;

a plurality of first insulating portions each provided between one of the plurality of semiconductor portions and the fourth wiring; and a first contact electrically connected to an end of each of the plurality of first wirings in the second direction, wherein the plurality of semiconductor portions include a first semiconductor portion and a second semiconductor portion closer to the first contact than the first semiconductor portion, and a length of the first semiconductor portion in the third direction is smaller than a length of the second semiconductor portion in the third direction.

9. The semiconductor storage device according to claim 8, further comprising:

a plurality of fifth wirings arranged in the first direction and extending in the second direction;

a plurality of second variable resistance portions between the plurality of fifth wirings and the plurality of second wirings; and a second contact electrically connected to an end of each of the plurality of fifth wirings in the second direction and arranged opposite to the first contact.

10. The semiconductor storage device according to claim 9, further comprising:

a sixth wiring extending in the second direction and facing the plurality of semiconductor portions in the third direction;

a plurality of second insulating portions each provided between one of the plurality of semiconductor portions and the sixth wiring; and a voltage supply circuit capable of supplying different voltages to the fourth and sixth wirings.

11. The semiconductor storage device according to claim 9, further comprising:
- a plurality of seventh wirings arranged in the second direction above the plurality of second wirings and extending in the third direction;
- a plurality of other semiconductor portions each electrically connected to the other end of one of the plurality of second wirings in the first direction and one of the plurality of seventh wirings;
- an eighth wiring extending in the second direction and facing said other semiconductor portions in the third direction; and
- a plurality of third insulating portions each provided between one of said other semiconductor portions and the eighth wiring.

12. The semiconductor storage device according to claim 8, wherein
the plurality of first insulating portions are connected to each other.

13. The semiconductor storage device according to claim 8, wherein
a width in the third direction of the fourth wiring facing the first semiconductor portion is wider than a width in the third direction of the fourth wiring facing the second semiconductor portion.

14. A semiconductor storage device comprising:
a substrate;
a plurality of first wirings arranged above the substrate in a first direction intersecting a surface of the substrate and extending in a second direction intersecting the first direction;
a plurality of second wirings arranged above the substrate in the second direction and extending in the first direction;
a plurality of first variable resistance portions arranged between the plurality of first wirings and the plurality of second wirings;
a plurality of third wirings provided between the plurality of second wirings and the substrate, arranged in the second direction, and extending in a third direction intersecting the first and second directions;
a plurality of semiconductor portions each electrically connected to one end of one of the plurality of second wirings in the first direction and one of the plurality of third wirings;
a fourth wiring extending in the second direction and facing the plurality of semiconductor portions in the third direction; and
a plurality of first insulating portions each provided between one of the plurality of semiconductor portions and the fourth wiring,
wherein the first insulating portions contain oxygen (O) and hafnium (Hf) and include a tetragonal crystal as a crystal structure.

15. The semiconductor storage device according to claim 14, further comprising:
a first contact electrically connected one end of each of the plurality of first wirings in the second direction,
wherein the plurality of semiconductor portions include a first semiconductor portion and a second semiconductor portion closer to the first contact than the first semiconductor portion, and
one of the first insulating portions facing the first semiconductor portion is positively polarized, and another one of the first insulating portions facing the second semiconductor portion is negatively polarized.

16. The semiconductor storage device according to claim 15, wherein
said one of the first insulating portions has a different polarizability from said another one of the first insulating portions.

17. The semiconductor storage device according to claim 15, further comprising:
a plurality of fifth wirings arranged in the first direction and extending in the second direction;
a plurality of second variable resistance portions between the plurality of fifth wirings and the plurality of second wirings; and
a second contact electrically connected to an end of each of the plurality of fifth wirings in the second direction and arranged opposite to the first contact.

18. The semiconductor storage device according to claim 17, further comprising:
a sixth wiring extending in the second direction and facing the plurality of semiconductor portions in the third direction;
a plurality of second insulating portions each provided between one of the plurality of semiconductor portions and the sixth wiring; and
a voltage supply circuit capable of supplying different voltages to the fourth and sixth wirings.

19. The semiconductor storage device according to claim 17, further comprising:
a plurality of seventh wirings arranged in the second direction above the plurality of second wirings and extending in the third direction,
a plurality of other semiconductor portions each electrically connected to the other end of one of the plurality of second wirings in the first direction and one of the plurality of seventh wirings;
an eighth wiring extending in the second direction and facing said other semiconductor portions in the third direction; and
a plurality of third insulating portions each provided between one of said other semiconductor portions and the eighth wiring.

20. The semiconductor storage device according to claim 14, wherein
the plurality of first insulating portions are connected to each other.

* * * * *